United States Patent
Briglin et al.

(10) Patent No.: US 12,198,897 B2
(45) Date of Patent: Jan. 14, 2025

(54) HTCC ANTENNA FOR GENERATION OF MICROPLASMA

(71) Applicant: INFICON, Inc., East Syracuse, NY (US)

(72) Inventors: Shawn Briglin, Cazenovia, NY (US); Michael Vollero, Manlius, NY (US); John Gordon Wiley, Marietta, NY (US); Mario Weder, Syracuse, NY (US)

(73) Assignee: Inficon, Inc., East Syracuse, NY (US)

( * ) Notice: Subject to any disclaimer, the term of this patent is extended or adjusted under 35 U.S.C. 154(b) by 0 days.

(21) Appl. No.: 18/266,462

(22) PCT Filed: Dec. 9, 2021

(86) PCT No.: PCT/US2021/062555
§ 371 (c)(1),
(2) Date: Jun. 9, 2023

(87) PCT Pub. No.: WO2022/125745
PCT Pub. Date: Jun. 16, 2022

(65) Prior Publication Data
US 2024/0047178 A1    Feb. 8, 2024

Related U.S. Application Data

(60) Provisional application No. 63/124,401, filed on Dec. 11, 2020.

(51) Int. Cl.
*H01J 37/32* (2006.01)

(52) U.S. Cl.
CPC ....... *H01J 37/3211* (2013.01); *H01J 37/3255* (2013.01); *H01J 37/32715* (2013.01);
(Continued)

(58) Field of Classification Search
None
See application file for complete search history.

(56) References Cited

U.S. PATENT DOCUMENTS 7,372,209 B2 * 5/2008 Espiau ............... H01J 61/52
315/39
7,460,225 B2 * 12/2008 Karanassios ............ H05H 1/30
356/246
(Continued)

FOREIGN PATENT DOCUMENTS

CN    103130498 A    6/2013
CN    111893107 A  * 11/2020    ........... C12N 15/815
(Continued)

OTHER PUBLICATIONS

PCT/US2021/6255; International Search Report and Written Opinion; Date of Mailing Apr. 11, 2022 (14 pages).
(Continued)

*Primary Examiner* — Srinivas Sathiraju
(74) *Attorney, Agent, or Firm* — Barclay Damon LLP

(57) ABSTRACT

A plasma generation device for generating a plasma comprises a support having a first side and an opposing second side. The support is comprised of a ceramic matrix and a split-ring conductor is embedded in the ceramic matrix. A hermetically sealed via extends from the split-ring conductor to the second side of the support and connects to an electrical supply. A ground plane is formed on the second side of the support. A plasma is generated proximate to the first side of the support, and the support seals to a wall of the chamber such that the first side is exposed to the one or more gases inside the chamber and the second side is isolated from the plasma and the one or more gases inside of the chamber.

23 Claims, 16 Drawing Sheets

(52) U.S. Cl.
CPC .. *H01J 37/32816* (2013.01); *H01J 37/32954* (2013.01); *H01J 2237/327* (2013.01)

(56) References Cited

U.S. PATENT DOCUMENTS

| | | | | |
|---|---|---|---|---|
| 7,498,747 B2* | 3/2009 | Espiau | H01J 61/12 | 315/39 |
| 7,638,951 B2* | 12/2009 | DeVincentis | H05B 41/24 | 315/39 |
| 7,659,504 B1* | 2/2010 | Rich | G01N 21/3504 | 250/239 |
| 7,701,143 B2* | 4/2010 | DeVincentis | H01P 7/10 | 315/39 |
| 7,719,195 B2* | 5/2010 | DeVincentis | H01J 65/044 | 315/39 |
| 7,791,280 B2* | 9/2010 | DeVincentis | H01J 65/044 | 315/39 |
| 7,812,307 B2* | 10/2010 | Dutton | H01J 37/32366 | 250/288 |
| D627,918 S* | 11/2010 | Espiau | D26/105 | |
| 7,830,092 B2* | 11/2010 | Espiau | H05B 41/2806 | 315/39 |
| 7,855,511 B2* | 12/2010 | Espiau | H05B 41/2806 | 315/39 |
| 7,888,874 B2* | 2/2011 | Espiau | H01J 65/044 | 315/39 |
| 7,994,721 B2* | 8/2011 | Espiau | H01P 7/10 | 315/39 |
| 8,063,565 B2* | 11/2011 | Hafidi | H01J 65/044 | 315/39 |
| 8,143,801 B2* | 3/2012 | DeVincentis | H05B 41/24 | 315/234 |
| 8,179,047 B2* | 5/2012 | Espiau | H01J 65/044 | 315/39 |
| 8,277,727 B2* | 10/2012 | Pollak | A61L 2/14 | 422/23 |
| 8,342,714 B1* | 1/2013 | Rea | H01J 61/025 | 362/264 |
| 8,344,625 B2* | 1/2013 | Espiau | H01J 65/044 | 315/39 |
| 8,350,480 B2* | 1/2013 | DeVincentis | H01J 65/044 | 315/39 |
| 8,427,067 B2* | 4/2013 | Espiau | H01J 65/046 | 315/248 |
| 8,436,546 B2* | 5/2013 | DeVincentis | H05B 41/24 | 315/234 |
| 8,439,534 B1* | 5/2013 | Roe | F21V 29/763 | 362/418 |
| 8,487,543 B2* | 7/2013 | DeVincentis | H01J 65/046 | 315/111.21 |
| 8,525,412 B2* | 9/2013 | Espiau | H01J 65/044 | 315/39 |
| 8,545,067 B2* | 10/2013 | Espiau | F21S 8/086 | 362/431 |
| 8,690,391 B2* | 4/2014 | Drake | F21V 29/773 | 362/264 |
| 8,759,729 B2* | 6/2014 | Ben-Shmuel | H05B 6/666 | 426/107 |
| 8,884,518 B2* | 11/2014 | Espiau | H01J 65/044 | 315/39 |
| 8,941,040 B2* | 1/2015 | Ben-Shmuel | H05B 6/666 | 219/709 |
| 8,981,663 B2* | 3/2015 | Hollingsworth | H05B 41/2806 | 315/248 |
| 9,040,883 B2* | 5/2015 | Ben-Shmuel | H05B 6/666 | 219/696 |
| 9,078,298 B2* | 7/2015 | Ben-Shmuel | H05B 6/647 | |
| 9,099,291 B2* | 8/2015 | Atol | H01J 65/044 | |
| 9,167,633 B2* | 10/2015 | Ben-Shmuel | H05B 6/6402 | |
| 9,224,568 B2* | 12/2015 | Doughty | H01J 61/12 | |
| 9,330,889 B2* | 5/2016 | Denning | H01J 37/32247 | |
| 9,392,752 B2* | 7/2016 | Doughty | H01J 61/20 | |
| 9,551,668 B2* | 1/2017 | Harrison | G01N 21/66 | |
| 9,648,718 B2* | 5/2017 | Kato | H01J 65/044 | |
| 9,875,884 B2* | 1/2018 | Lopez-Avila | G01N 21/714 | |
| 10,080,264 B2* | 9/2018 | Ben-Shmuel | H05B 6/6402 | |
| 10,084,239 B2* | 9/2018 | Shaver | H01Q 19/104 | |
| 10,492,247 B2* | 11/2019 | Ben-Shmuel | H05B 6/6455 | |
| 10,535,506 B2* | 1/2020 | Hill | F16K 3/06 | |
| 10,674,570 B2* | 6/2020 | Libman | H05B 6/688 | |
| 10,750,606 B1* | 8/2020 | Liu | H05H 1/463 | |
| 11,361,955 B2* | 6/2022 | Murata | H01J 49/165 | |
| 11,523,474 B2* | 12/2022 | Ben-Shmuel | H05B 6/647 | |
| 11,664,197 B2* | 5/2023 | Hill | H01J 37/32577 | 134/1.1 |
| 11,690,160 B2* | 6/2023 | Eden | H05H 1/2406 | 315/111.21 |
| 2003/0084848 A1 | 5/2003 | Long | | |
| 2005/0099130 A1* | 5/2005 | Espiau | H01J 61/12 | 315/39 |
| 2009/0166068 A1 | 7/2009 | Takahashi et al. | | |
| 2011/0175531 A1* | 7/2011 | Urdahl | H05H 1/46 | 315/111.21 |
| 2011/0180699 A1* | 7/2011 | Cooley | H01J 49/162 | 250/423 P |
| 2013/0014943 A1* | 1/2013 | Harrison | G01N 1/10 | 166/264 |
| 2014/0159571 A1 | 6/2014 | Hopwood et al. | | |
| 2015/0015140 A1* | 1/2015 | Denning | H01J 37/32247 | 315/39 |
| 2016/0035550 A1* | 2/2016 | Perelman | H01J 49/00 | 250/288 |
| 2016/0053322 A1* | 2/2016 | Nelson | C12Q 1/6883 | 536/24.31 |
| 2016/0123927 A1 | 5/2016 | Persson et al. | | |
| 2016/0254133 A1* | 9/2016 | Lopez-Avila | H01J 49/161 | 250/282 |
| 2016/0276979 A1* | 9/2016 | Shaver | H01Q 15/148 | |
| 2017/0303382 A1* | 10/2017 | Smith | H01J 37/32247 | |
| 2019/0074166 A1 | 3/2019 | Ikeda et al. | | |
| 2019/0102886 A1 | 4/2019 | Guigues | | |
| 2021/0105887 A1* | 4/2021 | Eden | H05H 1/2418 | |
| 2021/0319992 A1* | 10/2021 | Briglin | G01N 33/0011 | |
| 2022/0048081 A1* | 2/2022 | Hill | B08B 9/46 | |
| 2024/0047178 A1* | 2/2024 | Briglin | H01J 37/32954 | |
| 2024/0063001 A1* | 2/2024 | Ye | C23C 16/52 | |

FOREIGN PATENT DOCUMENTS

| | | | | |
|---|---|---|---|---|
| GB | 2493080 A | * | 1/2013 | G01N 1/10 |
| JP | 2021189056 A | * | 12/2021 | G01N 21/73 |
| WO | WO-2022125745 A1 | * | 6/2022 | G01N 21/73 |

OTHER PUBLICATIONS

European Patent Office; Partial Supplementary European Search Report; Application No. 21904381.7; 17 pages.

Berglund et al.; "Evaluation of Dielectric Properties of HTCC Amumina for Realization of Plasma Sources"; Journal of Electronic Materials; vol. 44, No. 10, 2015.

Miura, N. and Hopwood, J.; "Instability control in microwave-frequency microplasma"; The European Physical Journal D., vol. 66, No. 5, May 2012; 10 pages.

Yang L et al.; "Passive wireless sensors fabricated by spark plasma sintering for ultra-high temperature measurements"; Smart Materials and Structures, IOP Publishing LTD., vol. 29, No. 11; Sep. 22, 2020.

* cited by examiner

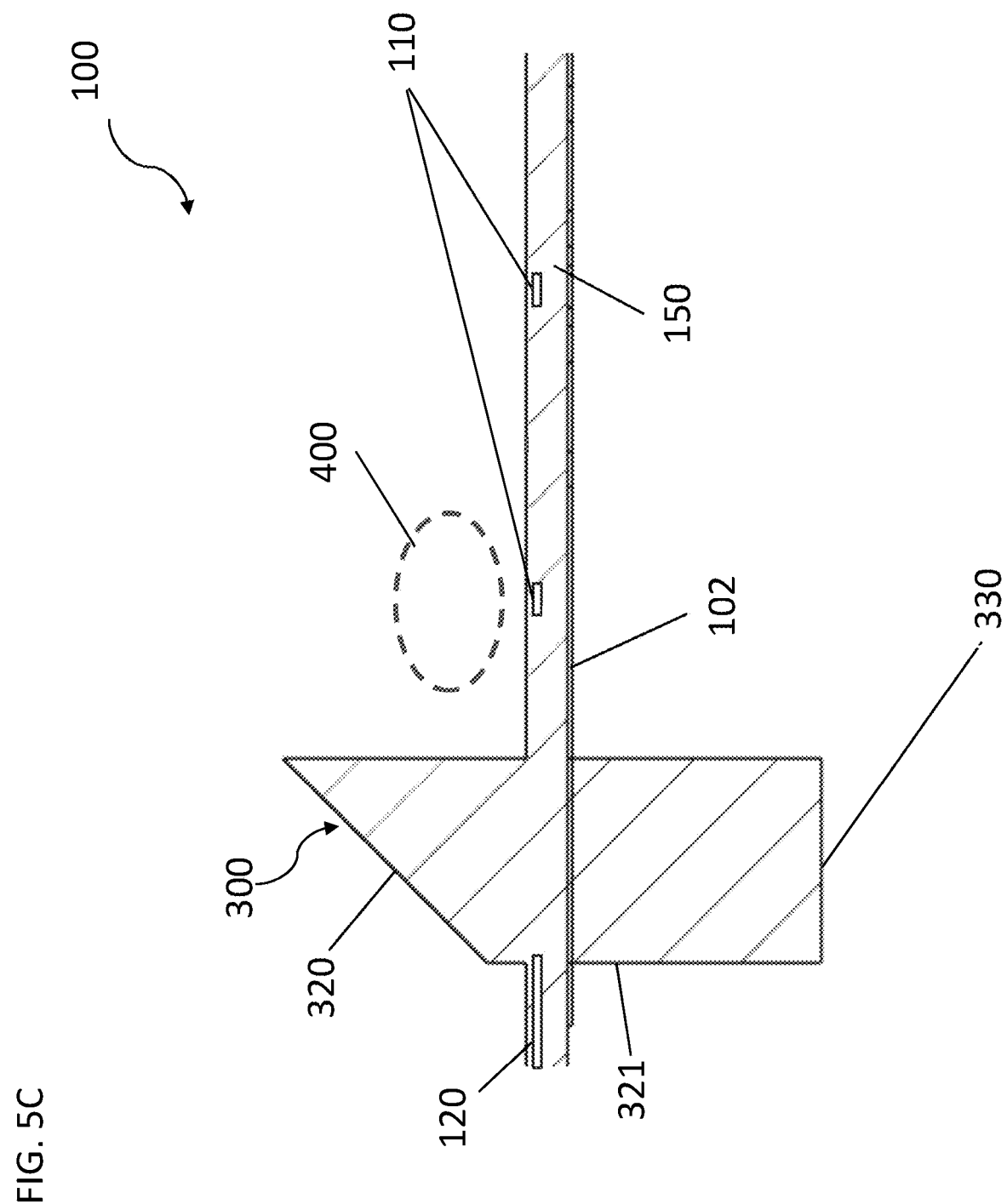

HTCC ANTENNA FOR GENERATION OF MICROPLASMA

CROSS-REFERENCE TO RELATED APPLICATIONS

This application is a national stage application pursuant to 35 U.S.C. § 371 of International Application No. PCT/US2021/062555, filed Dec. 9, 2021, which claims priority to U.S. Patent Application No. 63/124,401, filed Dec. 11, 2020, the entire contents of each application herein being incorporated by reference.

TECHNICAL FIELD

This invention relates generally to the field of electrical antennas for igniting and sustaining plasma, and specifically where the electrical antenna is a component of a gas sensor making use of the plasma emission for spectroscopic analysis to determine the nature of a gas mixture.

BACKGROUND

Semiconductor processing tools require ultra clean wafer processing chambers that maintain tight control over a number of gases used or produced during wafer processing. It is important to the operation of the processing tools to accurately measure the makeup of these process gases. Accurate measurement of the process gases aids in optimizing process recipes and also provides endpoint control. Another factor in ensuring ultra clean wafer processing is quickly detecting and locating leaks in the semiconductor processing tool. In addition, characterizing backgrounds such as water or hydrocarbon contaminants after periodic maintenance is also important in order to maintain product yield and quality.

Many semiconductor tools use plasma to facilitate deposition and etch processing. For example, plasma is necessary for most sputter deposition processes and also plays a role in plasma enhanced atomic layer deposition, plasma assisted chemical vapor deposition, and most etch processes. The light emitted directly from these plasmas is sometimes monitored through a window in the process chamber to enable the quality control measurements mentioned above using a method called optical emission spectroscopy (OES). However, it is sometimes desired to monitor gases in the process chamber when the plasma source is not enabled or in chambers where a plasma source is not used, such as buffer/transfer or degas chambers. In other cases, the plasma source may be positioned away from or remote from the process chamber so that only the chemical products enter the process chamber. Consequently, for the above-mentioned situations it is not always possible to use the plasma source of the process chamber to analyze the process gases.

In some instances, gases and leaks may be monitored with residual gas analyzers based on mass spectrometry. Unfortunately, mass spectrometers require lower pressures for operation than the pressures used during most semiconductor processing. Therefore, to use mass spectrometry additional pumping is required in order to reduce a sample pressure for analysis. This additional pumping adds costs and slows the response time of the system. Additionally, the ion-optical lens systems of mass spectrometers are particularly susceptible to damage from many of the film depositions used in building semiconductor devices. Even very thin layers of dielectrics cause charge buildup which degrades spectrometer performance and may prevent the mass spectrometer from working.

One alternative to either mass spectrometry or monitoring the process plasma is the use of a sensor that provides its own plasma source. Such a sensor may operate in a way that is analogous to the plasma OES measurement described above, but can be installed in a chamber where there is no plasma source, or can be used during times when the internal plasma source is not operating. Sensors of this type are hereafter referred to as Self Plasma-OES (SP-OES) sensors. (See, for example, U.S. Pat. Nos. 7,309,842, 7,123,361, WO10129277A2, US20200273676, and U.S. Ser. No. 10/262,841. See also, https://products.inficon.com/en-us/nav-products/product/detail/p-quantus-lp100/, http://www.nanotek.com/eng/products/products.php?ptype=view&prdcode=1608050006&catcode=181000&page=1&catcode=181000&searchopt=&searchkey=.)

These sensors (INFICON Quantus LP-100, Nanotek AEGIS etc. . . . ) are able to operate at pressures between about 1e-3 mbar and about 1 mbar. This pressure range covers some semiconductor processes, however many process chambers operate above this pressure range during at least some part of the process. For example, important processes like ALD and CVD typically operate at 10 s of millibars. Creating plasmas at lower pressures takes advantage of a longer mean free path of electrons, for example about 380 µm or more for pressures below 1 mbar, in order to use fairly low electric fields to impart sufficient energy to the electrons to ionize the gas molecules, thus creating the desired plasma. For example, the first ionization energy of argon (Ar) is 15.8 eV. Therefore, the electric field must be high enough to impart this much energy to a free electron between collisions with the surrounding gas molecules if the electrons are going to cause ionization of the argon. This suggests that the electric field required to ionize argon at 1 mbar pressure is 15.8 eV/(e*380 µm), or 41.6 kV/m (where e is the magnitude of the charge on the electron). As the pressure is decreased, the mean path length that the electrons travel between collisions with the background gas increases, and thus the energy that they acquire between collisions for a given electric field increases. Accordingly, lower pressures require lower electric fields to strike a plasma. This also implies that creating plasma at higher pressure typically requires higher electric fields to achieve ionization energies over much shorter mean free paths. For example, ionizing Ar at 50 Torr will require about 2E6 V/m since the mean free path for electrons at this pressure is only about 8 µm, and 15.8 eV is still required to ionize Ar.

Some approaches have been investigated for generating microplasmas that can operate at higher pressures (these plasmas are often called microplasmas because they typically have characteristic lengths of less than about 1 mm). These approaches include DC discharges, high frequency AC discharges, and also microwave discharges. For example, microwave resonant circuits including antennas in the form of microstrip split-ring resonators have been one such approach. U.S. Pat. No. 6,917,165 to Hopwood discloses the construction of a microwave microstrip resonator in the shape of a ring with a small gap at the resonator ends, or split-ring resonator. This structure is patterned in metal onto a thin dielectric substrate with a metal ground plane on the opposing face of the dielectric substrate. The resonance frequency is determined by the ring circumference such that this length corresponds to one half wavelength in the conductor. The impedance is set by the position along the resonator at which the resonator is driven and by the characteristic impedance of the microstrip. Driving the resonator with small low-power RF amplifiers, such as those now available for telecom and Bluetooth, generates electric potentials at the resonator ends that are 1800 out of phase with each other. This creates an electric field near the resonator gap that is sufficient to ignite and sustain a microplasma in many gases and at pressures ranging from below 1 mbar and up to and slightly above 1000 mbar. There are many potential uses for microplasmas including disinfection and as a controlled light source. In one application the plasma source may be exposed to a process gas in a SP-OES.

Split-ring resonators, along with many other types of high pressure plasma sources with exposed electrodes, suffer from limited lifetimes because the tips of the resonators are quickly eroded by the plasma itself. This erosion reduces the generated electric field as the geometry of the tips of the split-ring resonator changes. The changes in tip geometry also cause changes in electrical characteristics, such as the resonance frequency and impedance. Another disadvantage of split-ring resonators is that the material from the eroding split-ring conductor may be redeposited onto other areas of the dielectric substrate, which reduces the quality factor of the resonator. As the quality factor falls, the maximum generated electric field falls, which reduces the efficiency of the plasma source and also the pressure range over which the plasma source can operate. The material of the split-ring conductor can also be redeposited onto the window used to collect light for the OES causing undesirable loss of collected light. Furthermore, sputtering of the split-ring conductor into a semiconductor process chamber is unacceptable. Contamination of the process with this sputtered material could destroy the produced wafers. Sputtering of the conductor can also create particles that may damage some semiconductor processes.

Covering the device antenna with a thin layer of dielectric such as glass has been demonstrated to prevent erosion of the ring. However, differential thermal expansion and chemical incompatibility prohibit the use of most glasses in semiconductor processes. Maximum temperatures and process chemistries further prohibit the use of materials like silicon glass or polyimide plastics that might be used to cover a resonator. Additionally, certain metals must absolutely not be exposed to the semiconductor process because of the danger of poisoning the process. For example, even ultra-trace amounts of gold or copper coming from the sensor could destroy the electrical properties of the silicon wafers whose processing is being monitored. As a result, the conductor materials must be completely encapsulated in a way that isolates them from the process chamber even in the event of excessive temperatures and/or exposure to etch chemistries.

For sensors designed to operate in the harsh environments of the semiconductor industry, there are limitations in the wetted materials that are considered acceptable. Processes such as etch and chamber cleans use corrosive gases, such as nitrogen trifluoride ($NF_3$), and high process temperatures that can range above 400° C. Therefore, any sensor must be designed to prevent exposure of unacceptable materials to the semiconductor process while being robust enough to survive the harsh conditions of the semiconductor process. Covering the plasma-generating antenna with most silicon containing glasses fails because these glasses are quickly eroded by etch gases configured to remove silicon (e.g., $NF_3$ reacts with Si to make volatile silicon tetrafluoride ($SiF_4$)). A thin coating (tens of nanometers) on the antenna with ALD alumina would not survive most semiconductor processes. Alternatively, a thick alumina coating on the antenna, like plasma spray, suffers from adhesion problems. If the thick alumina coating fails, then the release of alumina particles could destroy semiconductor tools and process wafers. Moreover, the plasma source antenna must be sufficiently low in cost so that it can be readily replaced in the field.

An additional problem exists for measurement systems designed to operate at pressures from about 1 mbar to about 1000 mbar. In this pressure range, the mean free path of gas molecules is typically very short relative to the dimensions of the sensor. If a gas cell housing, a plasma source, and a window for light collection are constructed in a way such that the gas being monitored must travel a long distance to get in and out of the cell, then by the limits of diffusion the sensor will not respond quickly enough to address some common problems in the semiconductor industry. For example, one type of leak can occur when a slit valve is briefly opened to permit movement of a wafer from a transfer chamber and into a process chamber. This leak can be very short in duration, and quick response is necessary to detect this leak and identify the source. Therefore, it is important to design a sensor that can be in close communication to the process environment with minimal intervening passages.

These are just some of the problems associated with Self Plasma-OES sensors currently in use, especially with regards to monitoring semiconductor processing tools.

BRIEF SUMMARY

The current disclosure is directed to a sensor that can be exposed directly to the process environment with minimal intervening passages. An embodiment of a plasma generation source comprises a split-ring resonator microstrip comprising a split-ring conductor and a ceramic dielectric matrix. A dielectric matrix is configured to support the split-ring resonator micro-strip, wherein the split-ring feature is embedded within the ceramic matrix. In an embodiment, the dielectric is comprised mostly of $Al_2O_3$ or other process compatible material. In an embodiment, the split-ring conductor is comprised of a refractory metal. In an embodiment, the ceramic matrix is hermetic and configured to isolate the split-ring conductor from a process and the plasma generation source is sealed at a front face. The plasma generation device may further comprise a light collection element configured to protrude from a flange. In an embodiment, the light collection element is a collimation lens positioned proximate the split-ring conductor and comprises a curvature configured to match plasma light to an input field of view of a fiber or spectrometer.

An embodiment of a plasma generation device for generating plasma from one or more gases inside of a chamber comprises a support comprising a ceramic matrix and having a first side and an opposing second side. A split-ring conductor is embedded in the ceramic matrix and a hermetically sealed via extends from the split-ring conductor to the second side of the support. The hermetically via is configured to connect to an electrical supply and a ground plane is formed on the second side of the support. A plasma is configured to be generated proximate to the first side of the support. The support is configured to seal to a wall of the chamber such that the first side is exposed to the one or more gases inside the chamber and the second side is isolated from the plasma and the one or more gases inside of the chamber.

In an embodiment, the ceramic matrix is comprised of at least one of $Al_2O_3$ and AlN. In an embodiment, the ceramic matrix is comprised of one or more materials that are compatible with the plasma and the one or more gases inside of the chamber. In an embodiment, the split-ring conductor is comprised of a refractory metal. In another embodiment, the plasma generation device comprises at least one plasma starting electrode where each electrode comprises a hermetically sealed via extending through the ceramic matrix from the first side to the second side of the support. In an embodiment, the at least one starting electrode is comprised of a refractory metal. In still another embodiment, the plasma generation device comprises multiple starting electrodes that are spaced relative to each other at predetermined distances to enable the starting of plasmas over a predetermined range of pressures, such that the distance between the starting electrodes can be increased or decreased depending what range of pressures the plasma generating device will be used to generate plasmas.

In an embodiment, the plasma generation device also comprises a light collection element traversing the ceramic matrix and the ground plane. The light collection element is configured to collect light emitted by the plasma and transport the light through the ceramic matrix and the ground plane for observation from the second side of the support. The light collection element is hermetically sealed against the ceramic matrix. In an embodiment, the light collection element is a lens positioned proximate to the split-ring conductor. In an embodiment, the lens comprises a curvature configured to optimize transferal of said light to an input field of view of one of: (1) an optical fiber; (2) optical fiber bundle; and (3) a spectrometer.

An embodiment of a gas sensor comprises a split-ring resonator micro-strip comprising a split-ring conductor surrounded by a ceramic matrix and configured to generate plasma. An optical element configured to collect plasma light penetrates through a via in the ceramic matrix. The optical element is hermetically sealed to the ceramic matrix using one of a braze seal and a compression seal and the ceramic matrix comprises alumina. In an embodiment, the optical element comprises sapphire. The sapphire may be configured to thermally match the alumina of the ceramic matrix and the split-ring conductor. In an embodiment, the optical element comprises a lens shape. In an embodiment, the optical element comprises a light pipe. The light pipe may terminate at an angle that is configured to accept light from near a center of the ends of the split-ring resonator and direct the light through the split-ring resonator. In another embodiment, the gas sensor further comprises an antenna connection configured to receive RF energy from a cable and transmit light out by a fiber. In an embodiment, the gas sensor is configured to be operated with remote electronics and operate at temperatures above 120° C. In an embodiment, the gas sensor is configured to be installed directly into a test chamber. In another embodiment, the gas sensor further comprises a plasma shield and a light baffle.

An embodiment of a gas sensor comprises a plasma generating device having a first side and an opposing second side. The plasma generating device comprises a split-ring conductor surrounded by a ceramic matrix and configured to generate a plasma proximate to the first side. An optical element extends through the ceramic matrix between the first side and the second side and is configured to collect light emitted by the plasma. A connector is electrically connected to the split-ring conductor. The optical element is hermetically sealed to the ceramic matrix using one of: (1) a braze seal; and (2) a compression seal.

In an embodiment, the connector of the gas sensor or is an antenna connector configured to receive RF energy from a cable and an optical fiber is connected to the optical element and configured to receive light collected by the optical element. In an embodiment, the gas sensor further comprises remote electronics configured to interact with the gas sensor by means of the cable and the optical fiber, wherein the operation occurs at temperatures above 120° C. In an embodiment, the plasma generating device is configured to be exposed to one or more gases within a process chamber and serves as part of the wall of the process chamber. In an embodiment, the first side of the plasma generating device comprises a polished surface.

An embodiment of a method of manufacturing a split-ring resonator microwave plasma source comprises patterning a stack of ceramic tapes with a conductor using a screen printing process to produce a hermetically sealed antenna comprising a conductor trace. In another embodiment, the method further comprises polishing as-fired dielectric over the resonator electrodes. In another embodiment, the method further comprises adding witness marks to a conductor trace layer. During a cutting process the witness marks are exposed and used to guide polishing to a target thickness.

Another embodiment of a method of manufacturing a plasma generating device comprises forming a support from a ceramic matrix in a green state, wherein the support comprises a first side and an opposing second side. A split-ring conductor and a hermetically sealed via are embedded in the ceramic matrix during the forming of the support, wherein the via extends from the split-ring conductor to the second side of the support. The ceramic matrix with the embedded split-ring conductor is then fired and a ground plane is positioned proximate to the second side of the support before or after the firing. The first side of the support is polished to achieve a desired thickness of ceramic matrix between the first side and the split-ring conductor, wherein the desired thickness of the ceramic matrix corresponds to a desired resonance frequency.

An embodiment of a Self-Plasma optical emission spectroscopy (SPOES) system comprises a plasma generation device and a temperature sensor in thermal communication with the plasma generation device to determine the temperature of the plasma generation device. The temperature of the plasma generation device is taken into account during operation of the SPOES system. In an embodiment, the SPOES system further comprises a heater in thermal communication with the plasma generation device. The heater and the temperature sensor are configured to control the temperature of the plasma generating device. In another embodiment, the SPOES system comprising a plasma generation device and a light collection device, a VCR gland, and one of a ConFlat® flange and a KF flange, wherein the plasma generation device and the light collection device are brazed onto one of the VCR gland, the ConFlat® flange and the KF flange. In an embodiment, a two-connection flow through gas cell is constructed such that gas flow is largely parallel to the plane of the antenna and the optical window and where no feature of the gas passage or plasma chamber is larger than about 10 mm in a direction largely normal to the primary direction of gas flow.

An embodiment of a gas sensing system comprises a plasma generation device comprising a split-ring resonator microstrip. The split-ring resonance microstrip comprises a split-ring conductor and a ceramic matrix configured to surround and support the split-ring conductor. A temperature sensor is in thermal communication with the plasma generation device to determine the temperature of the plasma generation device such that the temperature of the plasma generation device is taken into account during operation of the gas sensing system. In an embodiment, the gas sensing system includes a heater in thermal communication with the plasma generation device. In this embodiment, the heater and the temperature sensor are configured to control the temperature of the plasma generation device.

Another embodiment of the gas sensing system includes a plasma generation device comprising a split-ring resonator microstrip. The split-ring resonator microstrip includes a split-ring conductor and a ceramic matrix configured to support the split-ring resonator microstrip. The split-ring conductor is embedded within the ceramic matrix. In an embodiment, the gas sensing system also includes a two-connection flow through gas cell defining a gas passage through a plasma chamber. An optical window is positioned approximately across the plasma chamber from and parallel to the ceramic matrix of the plasma generation device. The gas cell is configured to provide a gas flow in a direction that is approximately parallel to a plane of the plasma generation device and a plane of the optical window. The gas passage and the plasma chamber are comprised of features of a size smaller than about 10 mm along a direction that is approximately normal to the direction of gas flow.

High temperature co-fired ceramics, or HTCC, is a process used to produce metal and ceramic components. In this process, a green ceramic tape is built up in many layers. In between any of these layers a metallization made of a refractory metal can be used to define a spit-ring resonator electrode. This metallization could be patterned by screen printing, ink jet printed, or made using any other typical HTCC metallization process. The green materials and metallization are then fired at temperatures over 1200° C. to sinter the materials and remove binders. Built in this way, the metal feature of the split-ring resonator is completely embedded in the ceramic except for the connection to a single via that comes out of the ceramic through the backside, opposite to the side where the plasma is produced. It is to this via that an electrical connector is attached so that RF power can be delivered to the resonator from an appropriate power supply. By installing the resonator, or antenna, on a chamber keeping the via and connector outside of the process, all parts of the gas sensor then exposed to the process can survive certain semiconductor processing including surviving at high temperature and aggressive chemistries. By using a split-ring conductor comprised of a refractory metal, e.g., tungsten, and a dielectric comprised of alumina these parts of the device can be made to survive temperatures of over 1200° C. Metal seals (e.g., c-seals or wire seals) are required for operation at temperatures over 300° C. to seal the antenna to its sensor chamber or to seal it to a flange in cases where there is no sensor chamber. Since the antenna is constructed with high temperature materials, it is also compatible with braze processes enabling brazed-in windows and brazed connection.

BRIEF DESCRIPTION OF DRAWINGS

A more particular description of the invention briefly summarized above may be had by reference to the described embodiments, some of which are illustrated in the accompanying drawings. It is to be noted, however, that the appended drawings illustrate only typical embodiments of this invention and are therefore not to be considered limiting of its scope, for the invention may admit to other equally effective embodiments. Thus, for further understanding of the nature and objects of the invention, references can be made to the following detailed description, read in connection with the drawings in which:

FIG. 5C illustrates an enlarged schematic view of a portion of the embodiments of the gas sensor assemblies of FIGS. 5A and 5B;

DETAILED DESCRIPTION

The following discussion relates to various embodiments of an HTCC antenna for generation of plasma or microplasma. It will be understood that the herein described embodiments are examples that illustrate certain inventive concepts as detailed herein. To that end, other variations and modifications will be readily apparent to those of sufficient skill. In addition, certain terms are used throughout this discussion in order to provide a suitable frame of reference with regard to the accompanying drawings. These terms such as "upper", "lower", "forward", "rearward", "interior", "exterior", "front", "back", "top", "bottom", "inner", "outer", "first", "second", and the like are not intended to limit these concepts, except where so specifically indicated. The terms "about" or "approximately" as used herein may refer to a range of 80%-125% of the claimed or disclosed value. With regard to the drawings, their purpose is to depict salient features of the HTCC antenna for generation of a plasma or microplasma and are not specifically provided to scale.

Figure 1:
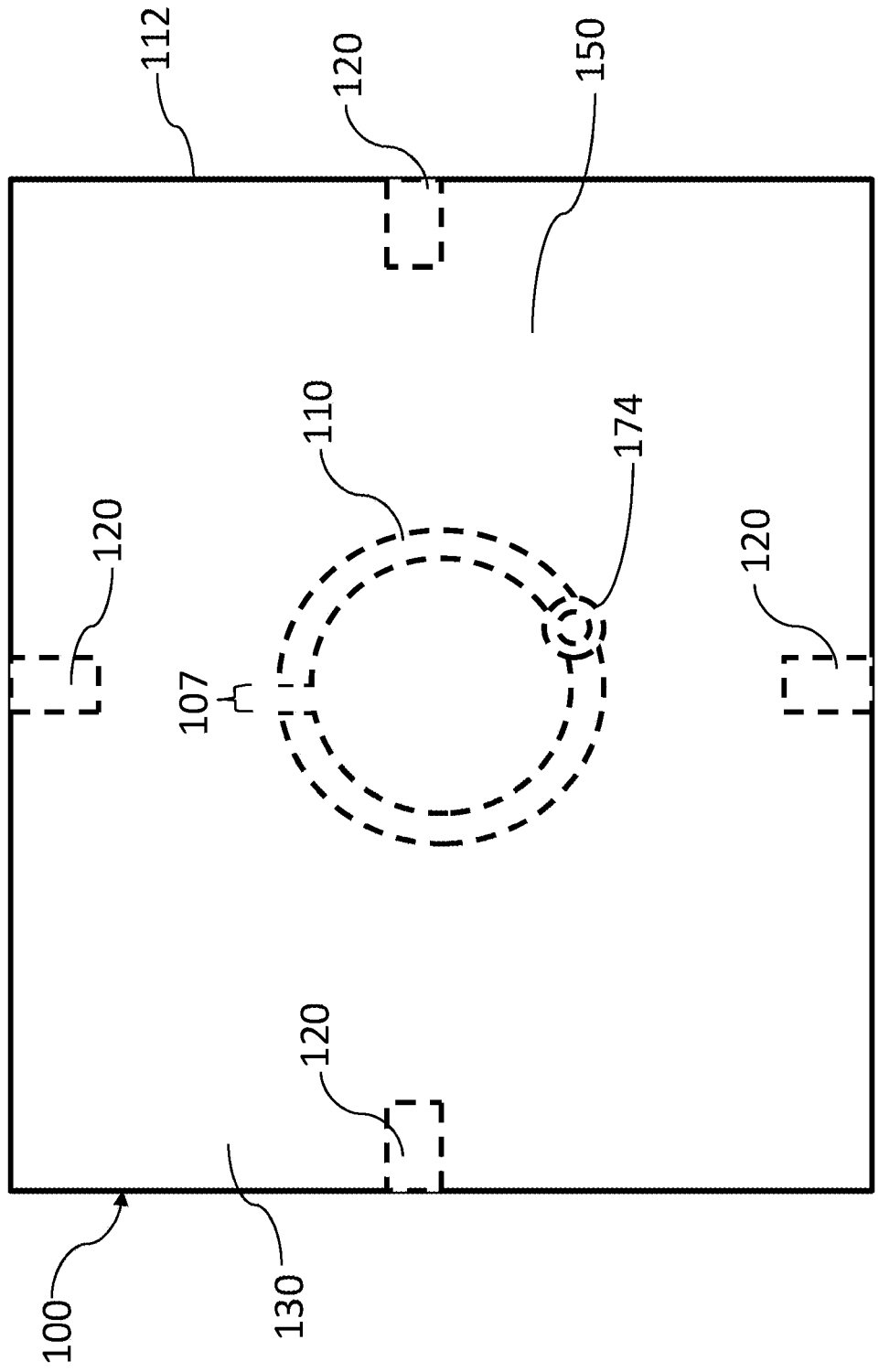
FIG. 1 illustrates a top view of an embodiment of a plasma generating device.
Figure 2:
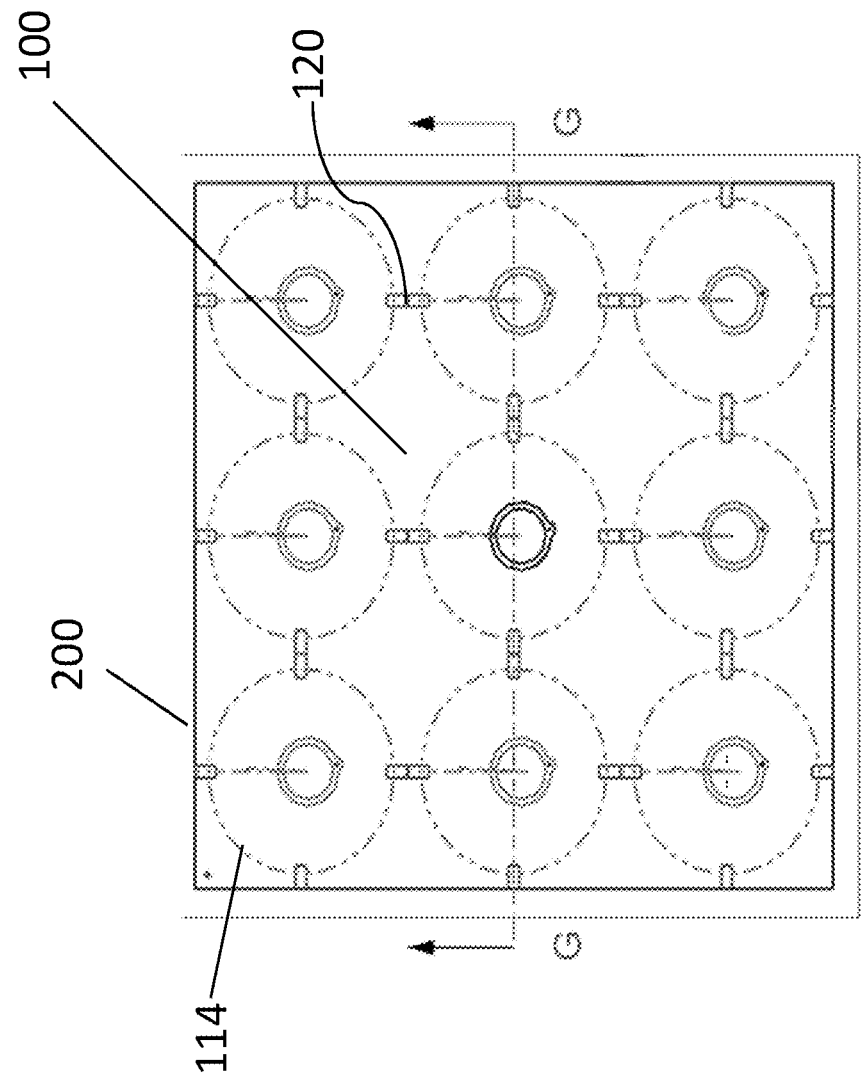
FIG. 2 illustrates a top plan view of an embodiment of a wafer comprised of a plurality of the plasma generating device of FIG. 1.

Referring to FIGS. 1-3, an embodiment of a microwave microstrip antenna used herein as a plasma generating device 100 is configured to create a high electric field or electromagnetic waves that interact with a surrounding environment to generate a plasma, indicated as circle/ellipse 400. The generated plasma 400 serves as a source of light with a spectrum that is dependent, among other things, on the make-up of the gas mixture from which it is generated. Analysis of this spectrum can be used to determine the composition of the surrounding environmental gases. In this way the presence of unwanted gases or vapors can be detected.

The plasma generating device 100 includes an antenna trace 110 that is embedded in a dielectric support comprised of a ceramic matrix 150. In an embodiment, the ceramic matrix 150 is a high-temperature co-fired ceramic (HTCC) matrix. As used herein, the terms "encapsulate(d)" and "embed(ded)," when used to refer to the position of the antenna trace 110 relative to the ceramic matrix 150, mean that the antenna trace 110 is completely enclosed within the ceramic matrix 150 such that no part of the antenna trace 110 is exposed. Referring to FIG. 1, the antenna trace 110 is shown in phantom indicating that it is embedded within the ceramic matrix 150, however in some embodiments, the antenna trace 110 may still be visible through the ceramic matrix 150 although no part of it is exposed. In an embodiment, the antenna trace 110 is a split-ring conductor or split-ring resonator. The antenna trace 110 may be operated at a particular frequency where it resonates, for example 2.45 GHz. The choice of frequency will impact size of the antenna trace 110. The antenna trace 110 defines a break or gap 107 having a width spanning a distance between the two ends of the antenna trace 110. The gap 107 may vary in width, but is generally preferred to be in the range of 25 to 100 microns. The high electrical field is generated within or in an area near the gap 107 and can initiate the plasma 400 formation in an area near the gap 107, such as an area above the gap 107. In this embodiment the gap 107 is entirely filled with the ceramic matrix 150 and the plasma generation occurs proximate to the top surface 130 of the first side 101. In an embodiment, the conductor of the antenna trace 110 may be comprised of tungsten and the HTCC matrix may be comprised of alumina ($Al_2O_3$), aluminum nitride (AlN), or other like materials. Embedding the antenna trace 110 in the ceramic matrix 150 acts to isolate it from corrosive environments that can be present in the process chamber.

While the term "ring" has been used with reference to certain embodiments of the antenna trace 110, this term is not meant to be limited to a circular ring, but may include all circular and non-circular shaped resonators, such as rectangular, elliptical, and other shapes.

The plasma generating devices 100 may be formed on wafers 200 as is illustrated in FIG. 2. Each plasma generating device 100 has a support comprised of a ceramic matrix 150 with a first side 101, process side or plasma side that will be exposed to a semiconductor production process or process chamber when in use and a second side 102, non-process side or non-plasma side (FIG. 3A) protected from or otherwise not exposed to a semiconductor process or process chamber. During the metallization of the antenna trace 110, features 120 are added at the same level in the HTCC stacking process. These will serve as guides or witness marks during a final polishing step discussed later. The plasma generating devices 100 are fired and then cut out of the wafer to make individual devices as diced squares 112 as is illustrated in FIG. 1, or laser or water jet cut to the desired shape (e.g., as circles 114 as shown in FIG. 2, or other shapes as required). Cutting of the plasma generating devices 100 occurs through the features 120. Feature 120 is positioned to be cut through during a cutting process and is shown in phantom in FIG. 1 indicating that it is positioned within the ceramic matrix 150, however in some embodiments the feature 120 may be visible through the ceramic matrix 150.

Figure 3A:
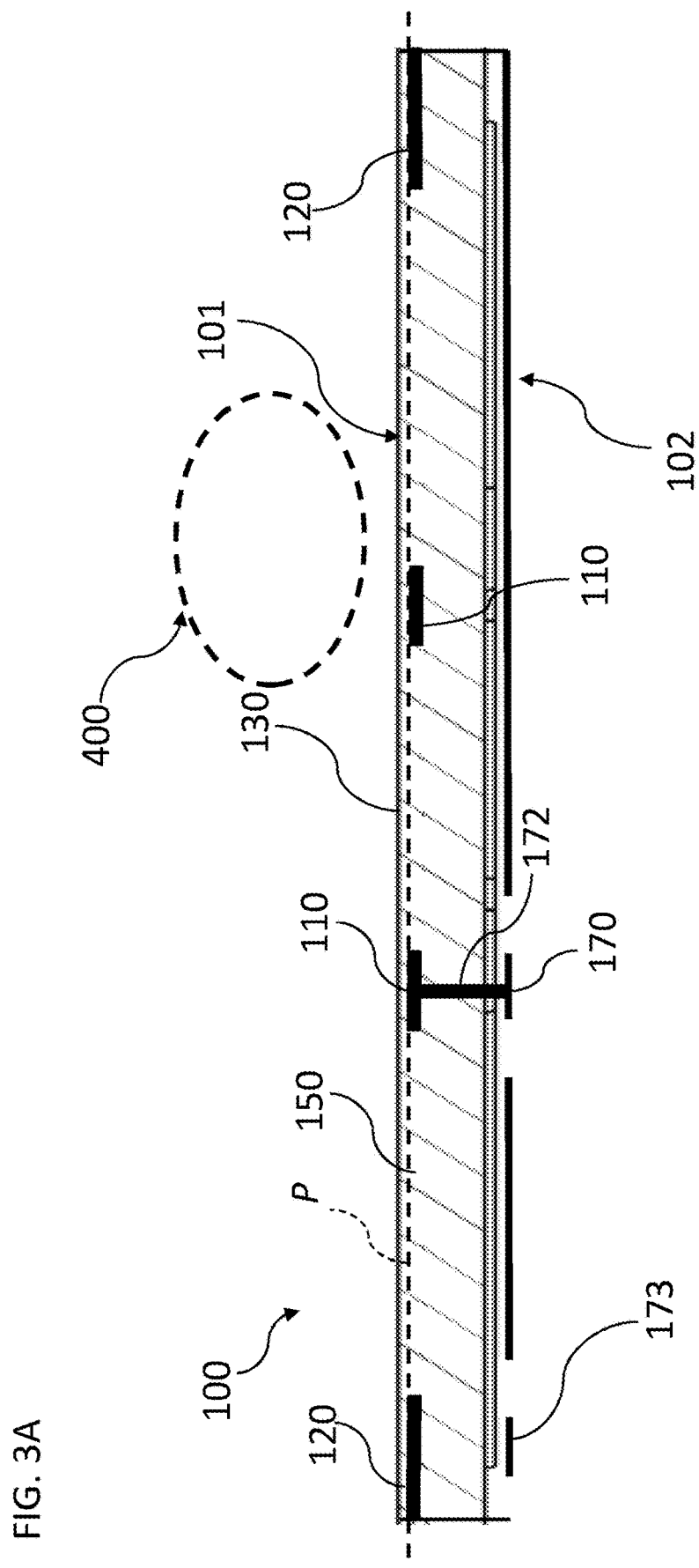
FIG. 3A illustrates a partial cross-sectional view of a plasma generating device of FIG. 2 along line G-G.
Figure 3B:
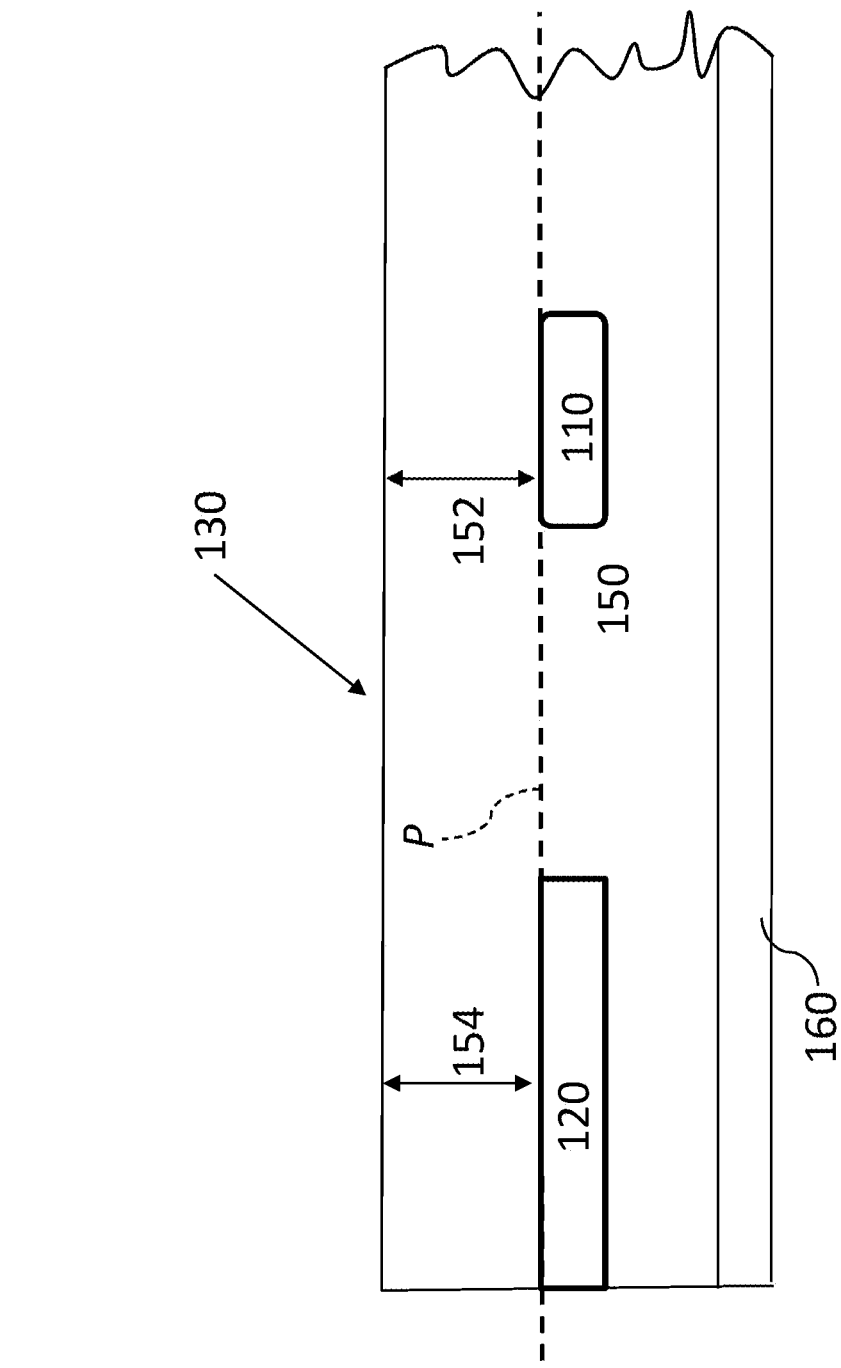
FIG. 3B schematically illustrates a close-up view of a cross-section of an embodiment of the plasma generating device.

FIGS. 3A-B illustrate a cross-section of one of the plasma generating devices 100 on wafer 200 of FIG. 2 along line G-G. As shown, the antenna trace 110 is embedded in the HTCC matrix 150. Feature 120 is exposed at an edge of the plasma generating device 100 after the dicing or cutting process and acts as a guide to measure the thickness 152 of the ceramic matrix 150 above the antenna trace 110, which is better seen in the schematic cross-section shown in FIG. 3B. As shown, the antenna trace 110 and feature 120 are positioned at a same distance from the top surface 130 or front face. In other words, plane P extends through both antenna trace 110 and feature 120 such that they are positioned at the same depth within the ceramic matrix 150 relative to the top surface 130. Tightly controlling the thickness 152 of the ceramic matrix disposed above the conductor trace 110 is necessary to achieve a desired resonance frequency and produce the high electric fields necessary to create plasma 400. The top surface 130 is polished down until the features 120 are at a target thickness (or distance) from the top surface 130 and thus the conductor trace 110 is the same target thickness (or distance) from the top surface 130. In an embodiment, the features 120 are witness marks (such as a flat or tab).

For example, with an RF power of 33 dBm, and an antenna gap 107 of 100 microns, when the thickness 154 from the top surface 130 to the witness marks 120 is 0.001 inch, sufficient electric fields are generated to create the desired plasma 400 while still providing good etch resistance and sputter resistance so that the antenna trace 110 can last many years. In contrast, when the thickness 154 between the top surface 130 and the witness mark 120 is less than 0.001 inch, the resulting antenna traces 110 are not as well protected. However, when the thickness 154 is substantially greater than 0.001 inch, then the desired high electric fields in the gap are inhibited. Other techniques to assess the thickness 154 of the ceramic matrix 150 between the top surface 130 and the witness mark 120, such as optical interferometry or spectral reflectance, typically fail due to the opaque optical quality of the ceramic matrix 150. The thickness 154 may be such that the antenna trace 110 (and the witness marks 120) is visible through the ceramic matrix 150 even though the antenna trace 110 is embedded within the ceramic matrix 150.

A ground plane 160 is positioned on the back or non-process side 102 of the ceramic matrix 150 to complete the plasma generating device 100. In an embodiment, the ground plane 160 may be positioned before or after the plasma generating device is sintered. The ground plane 160 is the ground reference and is comprised of an adhesion layer, such as titanium, followed with a plated layer of highly conductive material, such as gold. This region is not exposed to the semiconductor process as a seal is made between the outer edges or to the top surface 130 (FIGS. 3A, 3B, and 4) of the ceramic matrix 150 and the wall of a cell chamber 408 (FIG. 4) where the plasma will be generated and observed. A filled via 172 electrically couples the antenna trace 110 to a solder pad 170 (FIG. 3A) at a feed point 174 (FIG. 1). The solder pad 170 is generally positioned at the same level as but electrically isolated from the ground plane 160. Additionally, a ring 173 of nickel or other suitable metal can be plated on the adhesion layer to be used to make a braze connection to a housing or a flange. This feature can alternatively be on the outer cylindrical surface of the plasma generation device 100 in the case of a circular device. In certain embodiments yet to be described that include brazing processes, plating or gold or copper metallization of the ground plane 160 should occur after the braze step so that the ground plane is not destroyed by the high brazing temperatures.

Figure 4:
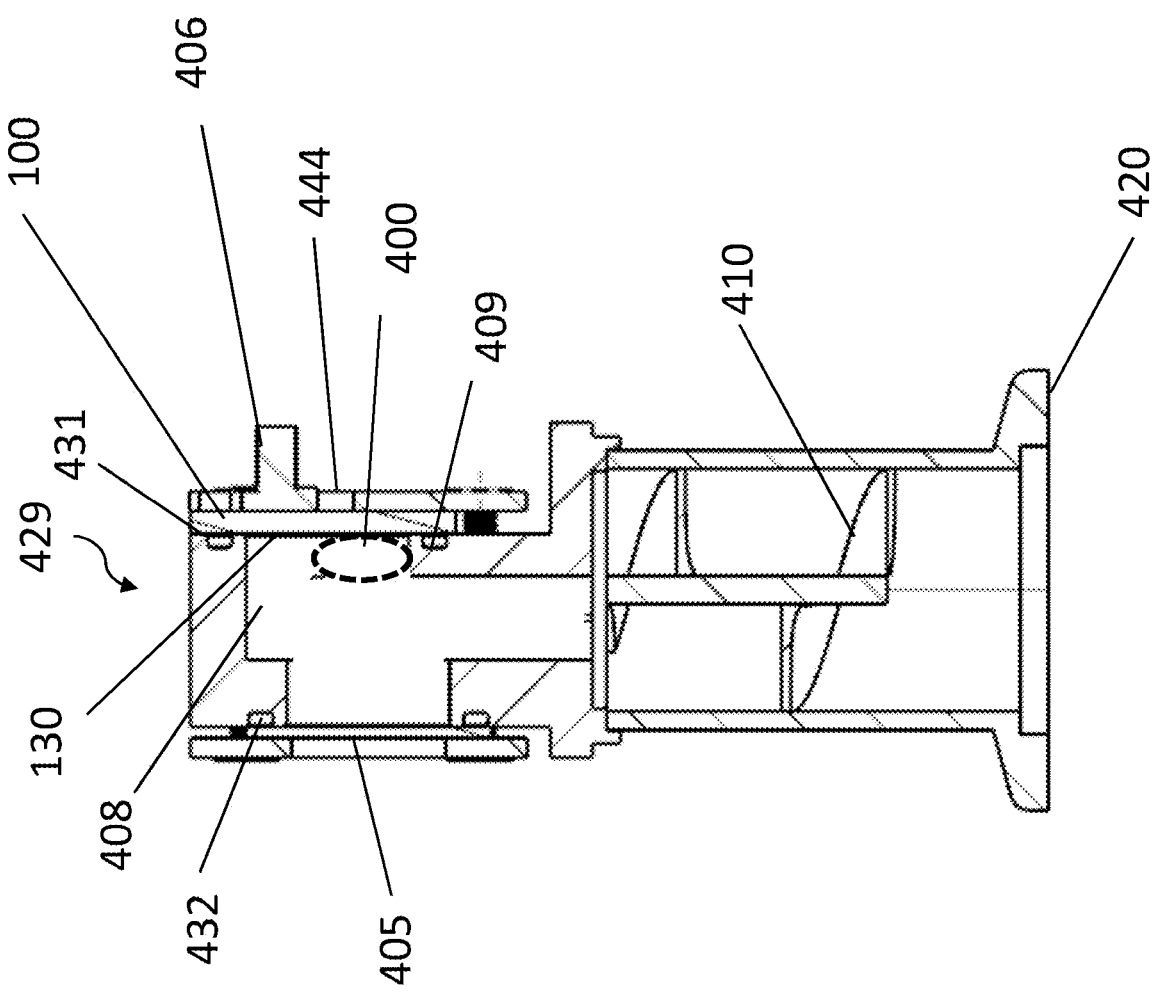
FIG. 4 illustrates a cross-sectional view of an embodiment of a gas cell assembly including an embodiment of the plasma generating device.

FIG. 4 illustrates a section of a gas cell assembly 429 including the plasma generation device 100. The gas cell assembly 429 is configured to be connected to a semiconductor process chamber, degas chamber, or transfer chamber. As shown, the process side 101 of the plasma generating device 100 becomes a wall of the cell chamber 408 such that the encapsulated split-ring conductor or antenna trace 110 would be inside or otherwise exposed to the cell chamber 408 of the gas cell assembly 429 if not for the ceramic matrix 150 surrounding it. RF energy is delivered through connector 406, which is soldered to the via 172 in the plasma generating device 100 to resonate the plasma generating device 100 and deliver the power necessary to ignite and sustain the plasma 400 in the cell chamber 408. The cell chamber 408 is connected to the process chamber being monitored via the process connection flange 420, which may be a KF-25 (although other flange styles could be used). An optical baffle 410 protects the plasma generating device 100 from other light sources, and protects other light sensitive components of the semiconductor process chamber from light generated by the plasma 400, without hindering gas flow significantly. The dimensions of the cell chamber 408 are from about 5 mm to about 20 mm, which is sufficient to contain the plasma 400 at most process pressures of interest, for example between about 1 Torr and 50 Torr. Seals are made with O-rings 431 and 432 that may be positioned in an O-ring groove 409. A window 405 is provided to enable light to exit the cell chamber for spectral analyses. Baffle 410 also decreases the deposition of process material from the process being monitored onto the window 405 in certain semiconductor tool installations. The cell chamber 408 may be formed from stainless steel, Hastelloy®, aluminum, or Inconel®, or any other compatible material. A clamp plate 444 presses the plasma generating device 100 against the O-ring 431 to make a gas-tight seal and also serves as a heat sink to reduce thermal expansion or contraction of the plasma generating device 100 resulting from changes in the plasma impedance, or after extinguishing or starting the plasma, or after changes in the tool recipe. This thermal change would alter the characteristic impedance of the plasma generating device 100 along with the resonant frequency, which could lower the quality factor and prevent efficient operation, prevent restarting the plasma, or could cause signal drift. The clamp plate 444 may be formed from stainless steel or a more thermally conductive material such as aluminum or copper.

With some pressures and processes, the isolation of the plasma 400 afforded by the positioning in the cell chamber 408 of the plasma generating device 100 away from the process connection flange 420 is desirable. However, with other processes and pressures, such as when the pressure is higher than 1 Torr and the process change to be measured is fast (<10 s), then the tortuous path to plasma 400 is unsuitably long. The ratio of the mean free path for molecules in the gas over the characteristic system dimensions is referred to as the Knudsen number, Kn. When Kn is greater than 1, gas molecules hit chamber walls before hitting each other and the flow is considered molecular. When Kn is between 1 and 0.01, the flow regime is considered to be transitional, and when the Kn is less than 0.01, gas molecules hit each other much more than the chamber walls and the flow is termed viscous. If the mean free path of the gas is much shorter than the dimensions of the sensor cell chamber and connecting components, low Kn, then the time-dependent gas composition in the cell chamber lags that in the process chamber being monitored and the effective sensor response time is too slow to be useful. For example, at a typical atomic layer deposition (ALD) process condition of argon carrier at 40 Torr, the mean free path for typical reagent molecules will be less than 1 μm, while the path length from the process connection flange 420 to the plasma 400 location is approximately 7 cm in the gas cell assembly 429. This would mean that, if the gas was flowing it would be in viscous flow. However, with a dead-end arrangement as in the gas cell assembly 429, any changes in gas composition in the process that is being monitored will only be communicated by diffusion to the plasma volume with a time constant on the order of many seconds, which depends particularly on the square root of the molecular mass of the diffusing species and the process temperature. Consequently, this would be far too slow to monitor many modern semiconductor processes, such as ALD with sub-second duration gas pulses and sub-ten-second pump out times.

Figure 5A:
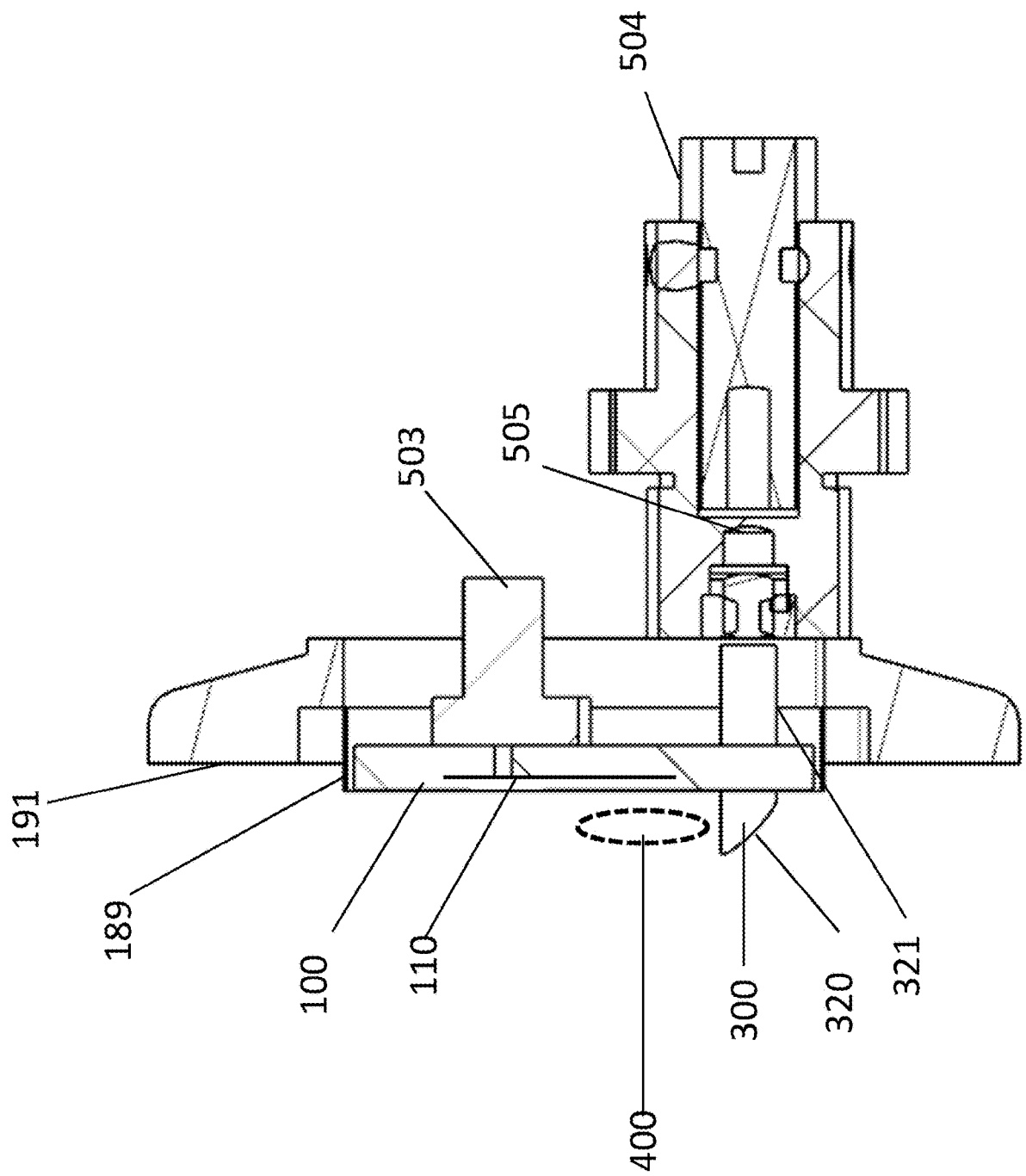
FIG. 5A illustrates a cross-sectional view of another embodiment of a gas sensor assembly with an embodiment of the plasma generating device.
Figure 5B:
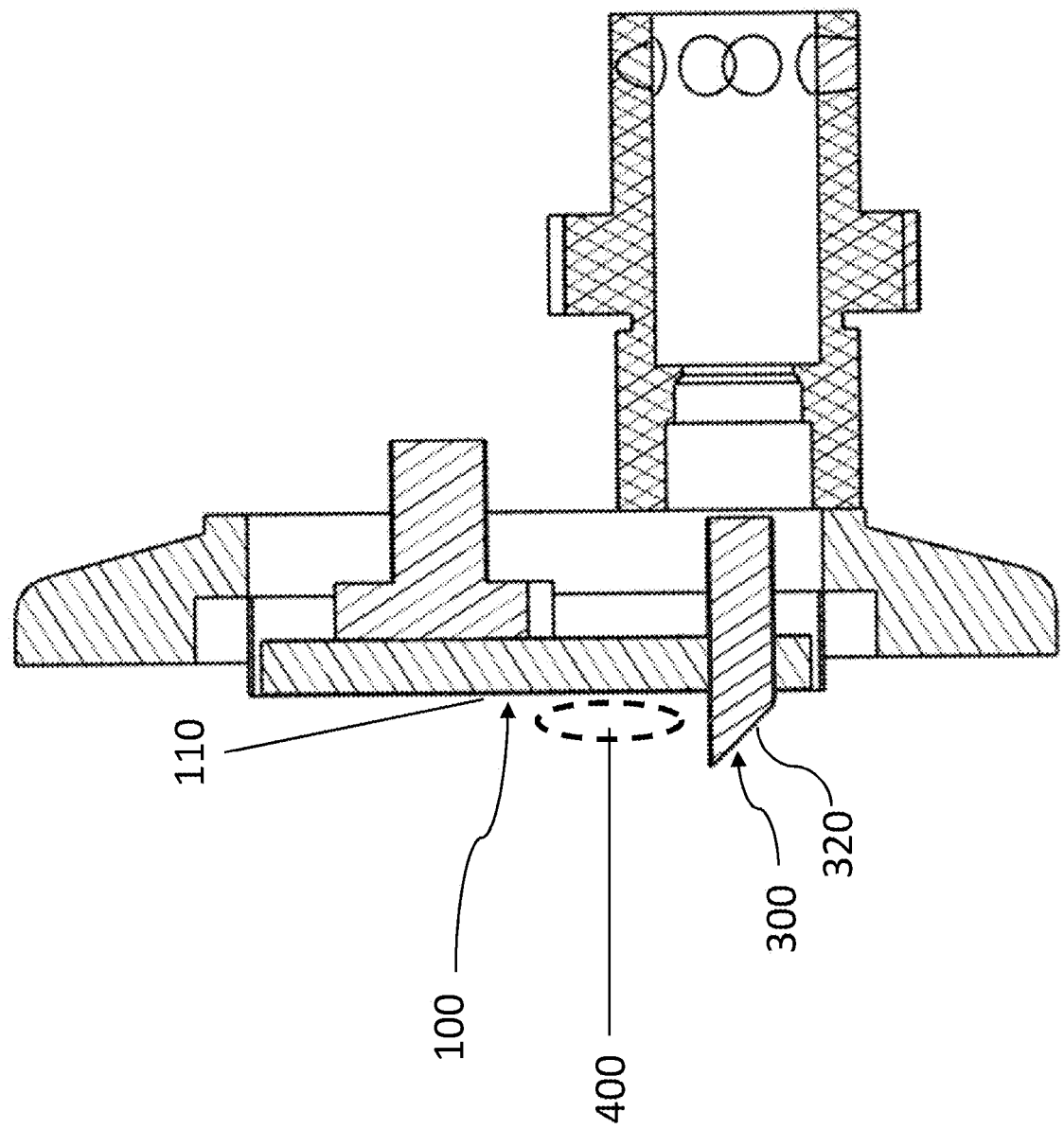
FIG. 5B illustrates a cross-sectional view of an embodiment of a gas sensor with an embodiment of the HTCC antenna that generates a plasma.
Figure 6:
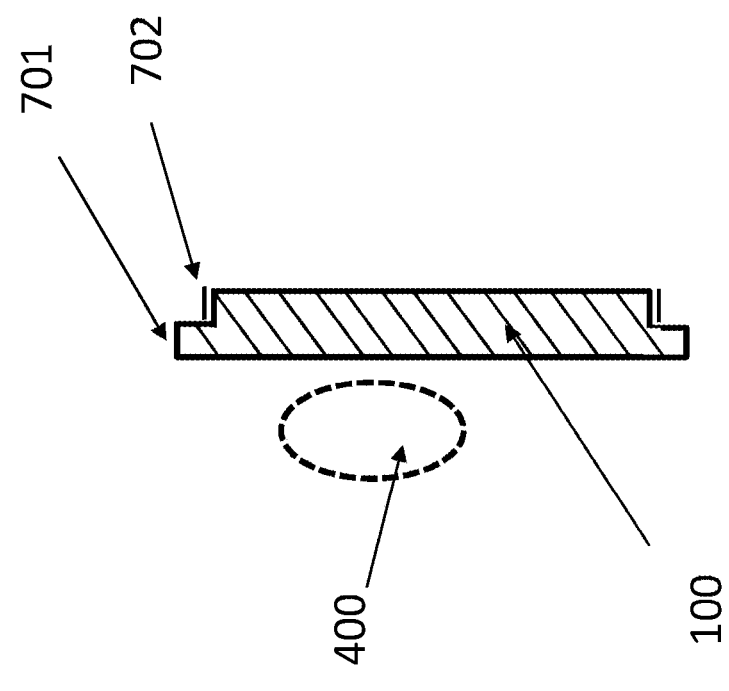
FIG. 6 illustrates a schematic representation of an embodiment of a shielding element.

FIGS. 5A-C illustrate another mounting arrangement of the plasma generating device 100 intended to provide better response time in chamber pressures where the mean free path is shorter than the dimensions of the cell chamber 408. A Kovar® or other metal ring 189 can be brazed to the edge of the plasma generating device 100 and subsequently welded or brazed to the flange 191. Brazes, such as Silver Copper, with melting points of approximately 780° C. may be used. In other embodiments, higher temperature brazes such as 35:65 gold copper brazes may be used. Brazing on the back provides the added benefit of isolating these materials from the plasma 400. As shown in FIG. 6, a shielding element 701 such as a step in the edge of the plasma generating device 100 may be used to prevent the plasma from reaching the braze metallization 702. This feature can be built into the stacked layers of ceramic tape used to form the plasma generation device 100 prior to firing, or alternatively may be ground into the plasma generating device 100 after firing by means of ceramic machining.

In one embodiment, rather than use a window separate from the plasma generating device for light collection, a window, light pipe, a light collecting element, or other light-collecting means can be sealed (attached via brazing, compression seal, or other attachment processes) through the ceramic matrix 150 of the plasma generating device 100. A hole is laser cut after sintering, but could also be punched in the green ceramic tape during the fabrication method described later. The light collecting means could be installed in this hole. Including the light collecting means in the plasma generating device enables installation of a plasma generating device 100 directly into the process chamber or transfer chamber, resulting in faster response times and permitting installation using a single port on the process chamber 500 or tool chamber. A separate light collection device (window) is not required, which permits a much more compact SP-OES system sensor. Although O-ring seals are possible with this geometry, they do not permit the high temperature operation desired by some applications. Still referring to FIGS. 5A-C, window or light pipe 300 may be ground to collimate light for efficient transfer into a fiber, fiber bundle, or spectrometer, or window 300 may comprise a first end 320 and a second end 330. The first end 320 may be cut at an angle to reflect light from plasma 400 through the plasma generating device 100 and serve as a light pipe defining an outer surface 321 and configured to efficiently transfer light into an optical fiber connector 504. Optical elements 505 may improve optical coupling of collected light into a spectrometer. Use of sapphire optical components permits the use of braze operations, and thermal expansion matching (for high temperature operation) with the plasma generating device 100 along with transmission of light with wavelengths from 200-2000 nm. Connection to the flange of the chamber 500 is made at 191. O-rings and aluminum knife edge seals are possible with this KF flange, but other flange configurations are also possible such as VCR and ConFlat® which typically make use of all metal seals for high temperature operation.

Figure 7:
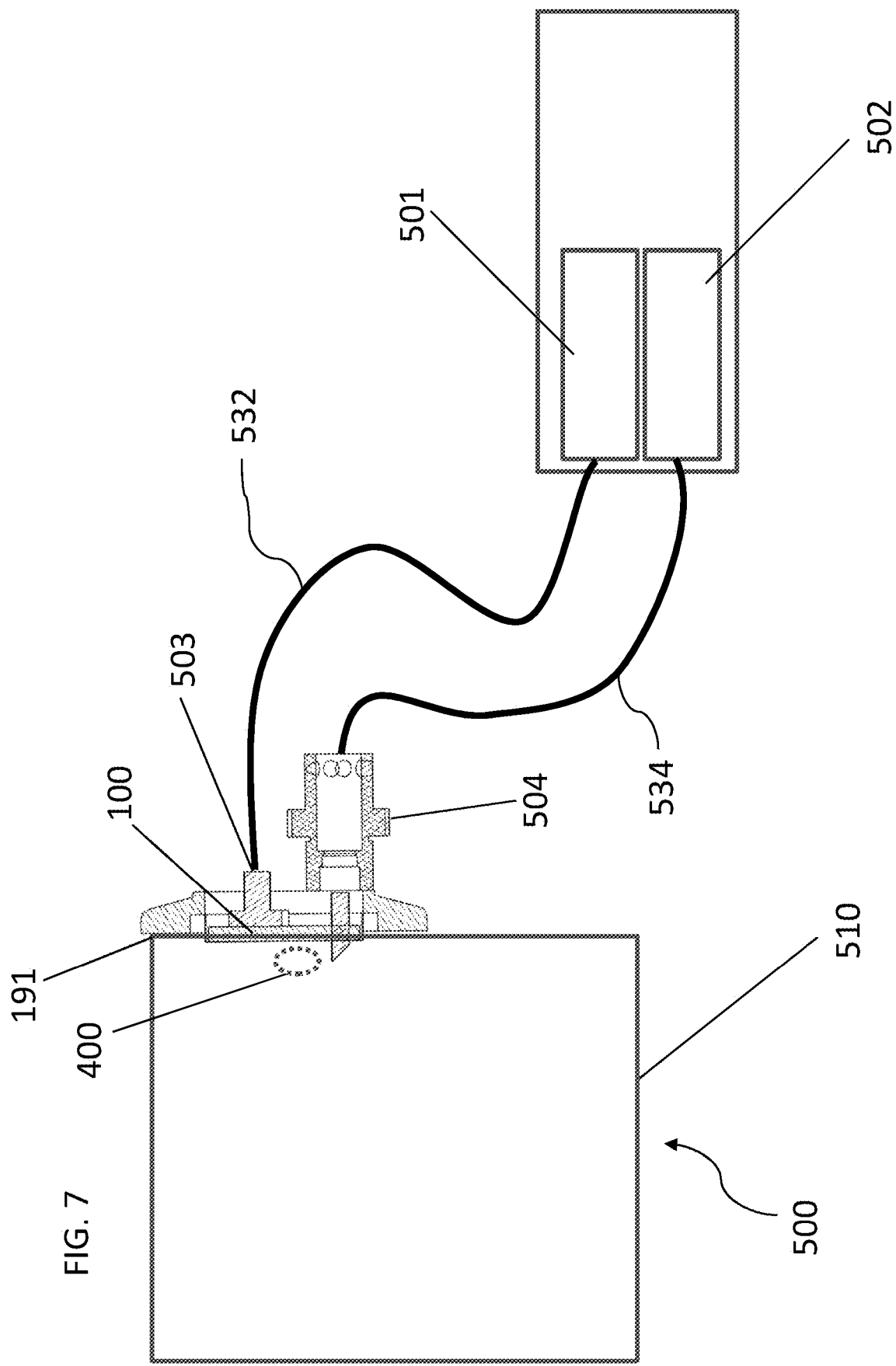
FIG. 7 illustrates a schematic view of an embodiment of a gas cell assembly with an embodiment of the plasma generating device and connected to an amplifier and a spectrometer or filter-photodiode system.

FIG. 7 illustrates a process chamber 500 at least partially surrounded by a process chamber wall 510 with the flange of the SP-OES sensor installed to a flange on the chamber 500. This permits the plasma generating device 100 to be installed so that it is near, flush, or inserted into the chamber 500, which eliminates any delay resulting from diffusion into the gas cell assembly 429, were it being used. The plasma generating device 100 in this configuration is immersed in the semiconductor manufacturing process. The RF compatible connector 503 is used to bring RF energy in to the plasma generating device and the optical fiber connector 504 is used to transport plasma-generated light out. An amplifier 501 generates the microwave frequency energy and section 502 contains a spectrometer or filter-photodiode system for measuring light from process gases in the plasma 400. The spectrometer is configured to measure light intensity as a function of wavelength over some range, e.g., 200-850 nm. From these spectra information about the makeup of the gases in the plasma can be derived. Alternatively, if only a particular known wavelength band is of interest, a filter that passes that band and a photodiode or photomultiplier could be used to monitor the plasma light. The cable arrangement 532, 534 permits the plasma generating device 100 to be installed in a limited space and to install the electronics and spectrometer or photodiode at some distance such that the electronics and spectrometer can remain suitably cool, as determined by the component specifications, even when the process chamber 500 is operated at elevated temperatures. In an embodiment, the electronics may enable remote operation of the gas cell assembly and/or the process chamber.

Figure 8:
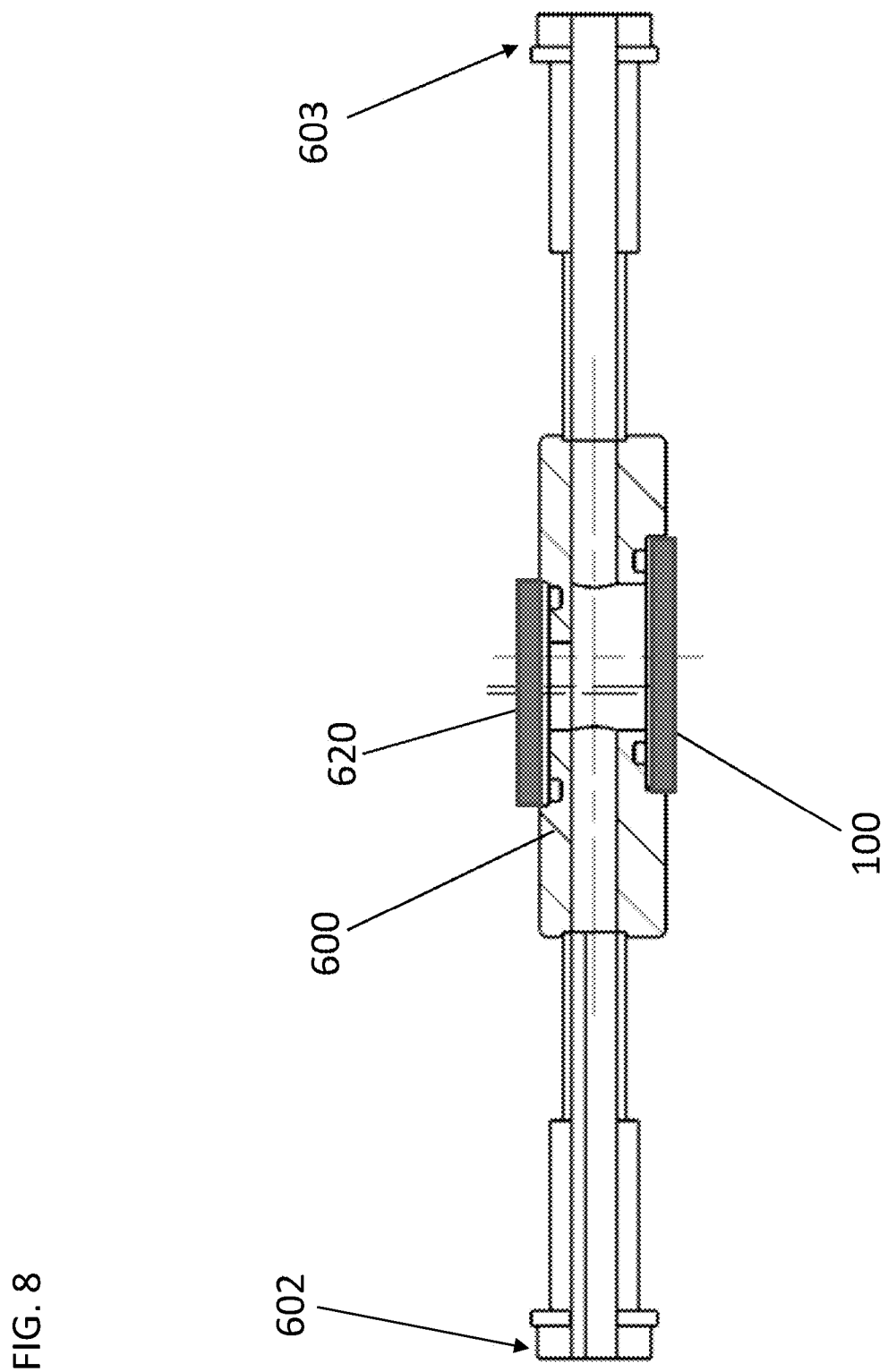
FIG. 8 illustrates a cross-sectional view of an embodiment of a gas cell assembly with an embodiment of the plasma generating device where there is both an entrance and exit connection for gas flow.

FIG. 8 illustrates another alternative to the appendage geometry depicted in FIG. 4. Flow-through cell 600 has geometry such that gas is flowed directly over the plasma generating device 100 which is located across the gas path from a cell window 620. This cell is streamlined with no unswept volumes so that it can provide a fast response to changes in gas concentration in a flowing gas stream such as in a gas delivery line or pump line. A limitation to this geometry is that it requires two connections 602, 603 which is not desirable for installation in some other applications.

Figure 9A:
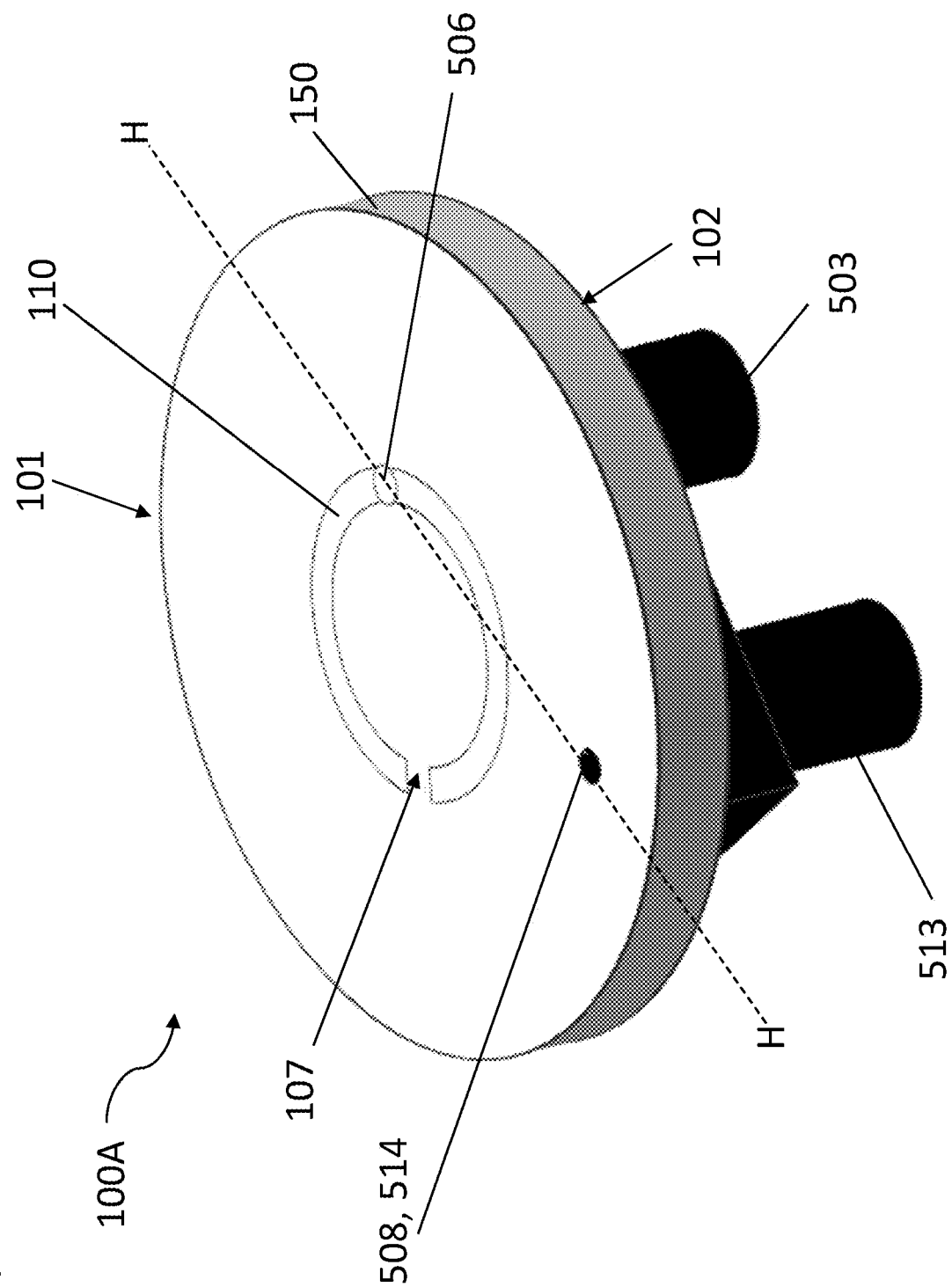
FIG. 9A illustrates a perspective top view of another embodiment of the plasma generating device.
Figure 9B:
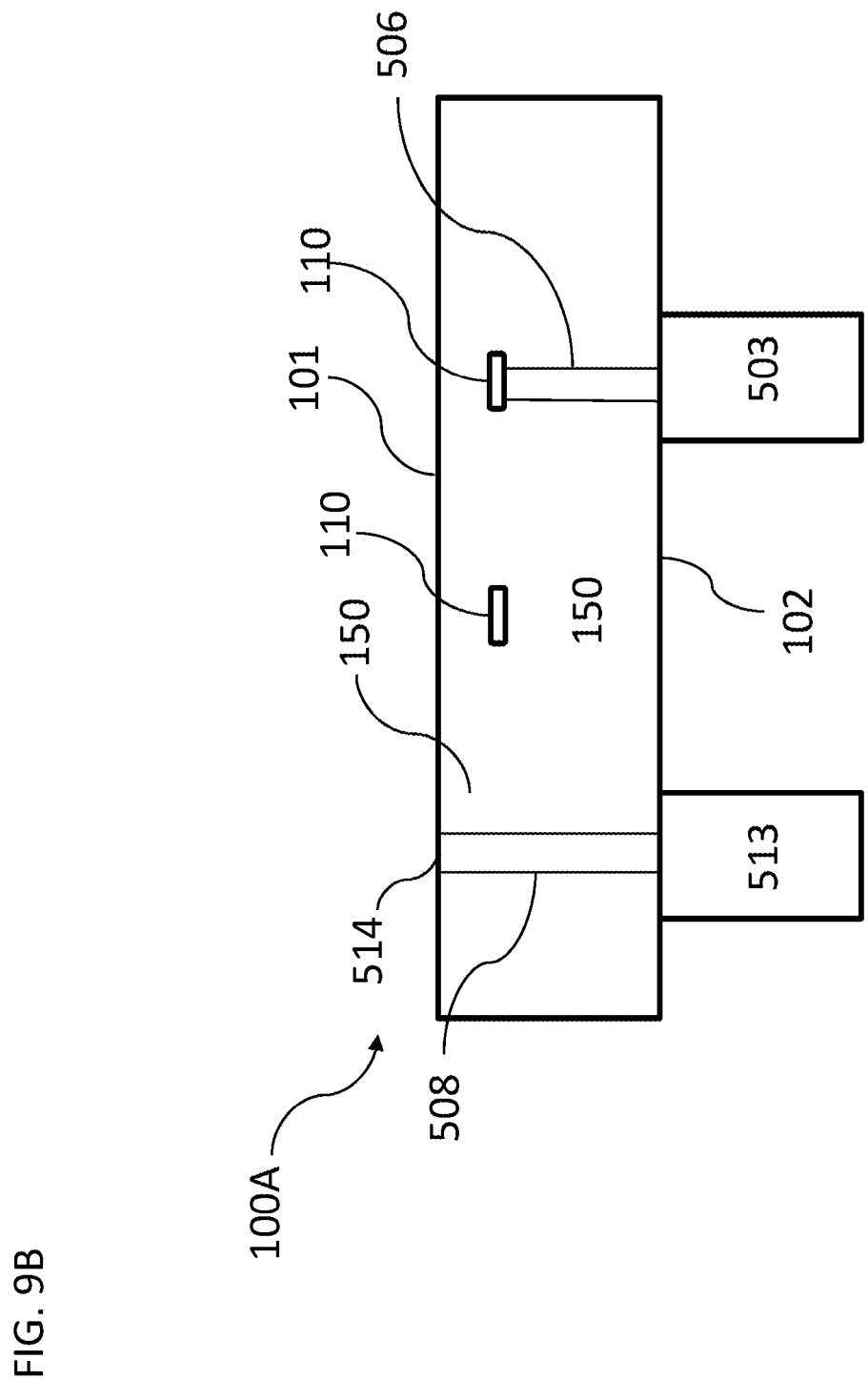
FIG. 9B schematically illustrates a sectional view if the embodiment of FIG. 9A along line H-H.

Another embodiment of the plasma generation device 100A is shown in FIGS. 9A-B. Similar to other embodiments previously discussed, the conductor trace 110 is surrounded by a ceramic matrix 150. Like those embodiments, the plasma generation device 100A includes a first hermetically sealed via 506 used to transport power from an RF compatible connector 503, such as an SMA connector, soldered to the non-process or non-plasma side 102, part way through the ceramic matrix 150 to the encapsulated antenna trace 110 of the plasma generating device 100A, which generates an electric field near its ends (in the gap 107) to light and sustain a plasma 400 (FIG. 3A). The hermetic via 506 is hermetically sealed such that it is air tight with respect to the ceramic matrix 150. In an embodiment, a second hermetically sealed via 508 extends from a second SMA connector 513 or other suitable high-voltage connector also soldered on the non-process side 102. The second via 508 does not terminate inside the ceramic matrix 150 at a buried conductor, but rather it extends through the process face of the ceramic matrix 150 where its end is exposed as a conductive electrode 514 to the process environment being monitored. The conductive electrode 514 has enough thickness such that it remains exposed on the surface of the process side 101 of the plasma generation device 100A after processing steps are performed. For example, a polishing step may be performed to remove an amount of the dielectric while still keeping the antenna trace 110 buried under a layer of ceramic matrix 150, but this electrode 514 would remain.

Under certain pressures or gas compositions, the electric fields near the gap 107 in the antenna trace 110 and extending through the dielectric are too low to initiate a plasma 400. In those instances, a high voltage signal such as a 10 Hz square wave of −3 kV is applied for several seconds to this second via 508 by way of connector 513. This causes a series of arc discharges between a wall of the process chamber 500 and the conductive electrode 514 exposed at the top of the via 508. This arc generates photons, electrons, and ions, and these species reduce the breakdown potential near the gap 107 in the split-ring conductor 110, which permits starting the plasma 400 under a wider range of pressure and/or gas conditions. Once this plasma 400 is started, it can generally be maintained without continued firing of electrode 514.

In some embodiments, the second via 508 and the conductive electrode 514 are also tungsten like the first via 506 and the antenna trace 110. Tungsten is desirable because it has a high mass density and low sputtering cross-section. The second via 508 is positioned such that the arc occurs to the grounded wall and close enough to the gap 107 in the antenna trace 110 to quickly ignite the plasma 400. Concurrently, the second via 508 is positioned far enough from the gap 107 of the antenna trace 110 so it is not damaged during generation of the plasma 400. In an embodiment, the second via 508 is positioned at a distance of 1 mm to the wall of the process chamber 500 and 7 mm from the gap 107 of the split-ring conductor 110.

In some embodiments, a signal from a photodiode or the signal from an attached spectrometer are analyzed in an FPGA or microcontroller to detect the plasma off state and initiate the high voltage waveform at the plasma starting electrode 514. Such a plasma starting device can be added to the plasma generating device 100, 100A at little or no additional cost while still producing a plasma generating device 100, 100A with a low profile. Conventional plasma starters, like a brazed feedthrough pin, are more expensive and they are more difficult to place near to the main plasma source—which is important at high pressures. In some embodiments, more than one additional conductive electrode 514 is added. In such cases, the distance between the electrodes 514 and/or between the electrodes and the wall(s) of the process chamber 500 can be selected in order to facilitate plasma ignition at different pressures. Knowing the target pressure and gas species, one can read off of the Paschen curve of breakdown voltage as a function of the product of distance and pressure the best spacing for a given power supply or, alternatively, choose a power supply to fit the available geometry. In an embodiment, the conductive electrodes 514 comprise a round or circular shape and are an extension of their respective via 508. In another embodiment, the conductive electrodes 514 comprise a shape other than a round or circular shape (such as a star shape) in order to produce higher electric fields. In yet another embodiment even more electrodes could be included in the plasma generating device 100A and positioned at various distances from each other and the chamber wall 510 in order to enable starting the plasma 400 over a wider pressure range. They could be driven from a plurality of connectors and voltage supplies. In other embodiments, the multiple electrodes may be connected together and driven from the same connector if it is the intention that they arc to the chamber or sensor wall. Each could be located at a different distances from the wall. The only real limitation will be the acceptable size and complexity of the plasma generation device.

A method of producing a plasma generation device 100, 100A such as the previously described embodiments, will now be described. In general, a plurality of layers of green ceramic tape are used to build up the support. The green ceramic tape is ceramic tape that has not been fired (or sintered). Between any of these layers of green ceramic tape, a metallization made of a refractory metal is used to define a spit-ring resonator electrode. This metallization could be patterned by screen printing, ink jet printed, or made using any other typical HTCC metallization process. The plurality of layers of green ceramic tape are stacked (the stacking process may employ one or more binders) and then fired at temperatures around 1200° C. to sinter the stacked materials and remove the binders. The result is a hermetically sealed antenna structure with a split-ring conductor 110 encapsulated in a ceramic matrix except for the connection to a single via that that extends through the second side 102 (side opposite the side where the plasma is generated) of the ceramic matrix 150 of the support. The hermetically sealed antenna structure is then polished in the area over the split-ring conductor 110 to achieve the desired thickness of ceramic matrix 150 between the first side and the split-ring conductor 110. The desired thickness of the ceramic matrix between the first side 101 and the split-ring conductor 110 corresponds to a desired resonance frequency. In other words, the resonance frequency of the plasma generating device 100, 100A can be tuned or otherwise changed by changing the thickness of the ceramic matrix 150 between the top surface 130 of the first side 101 and the split-ring conductor 110.

Figure 10:
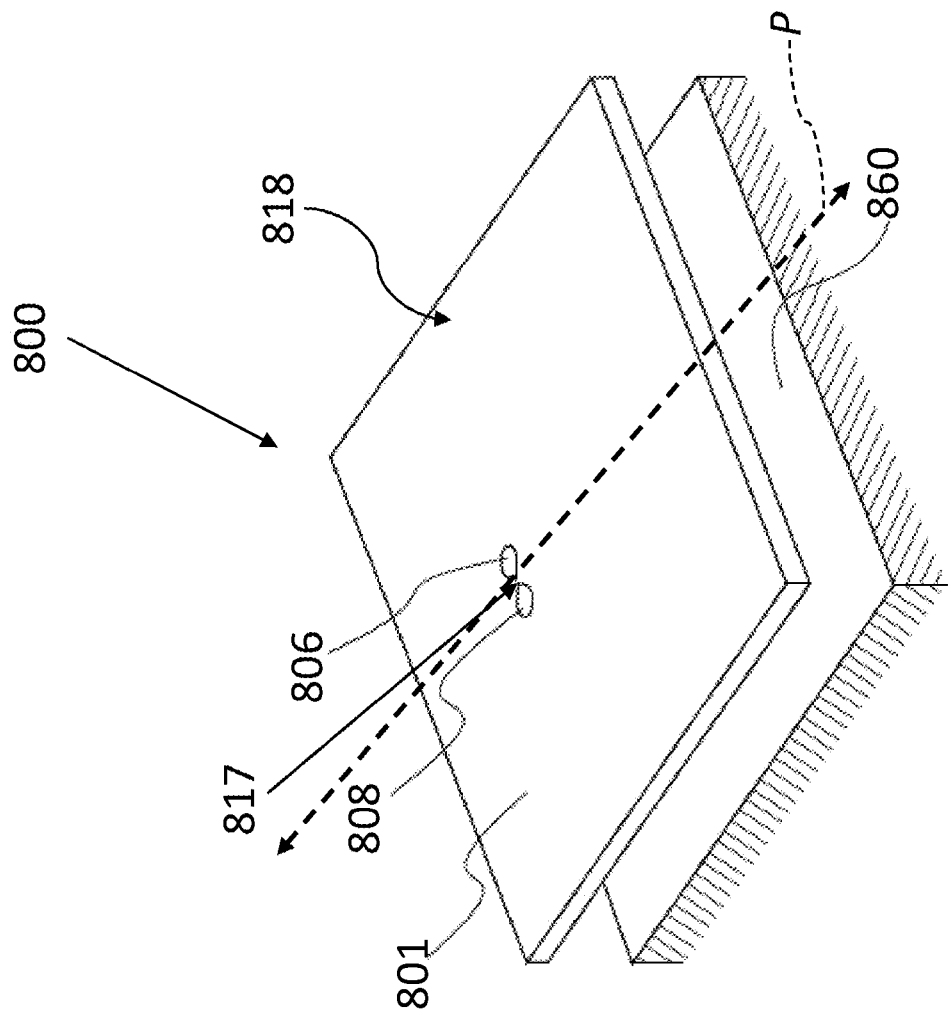
FIG. 10 illustrates a perspective top view of another embodiment of the plasma generating device.
Figure 11:
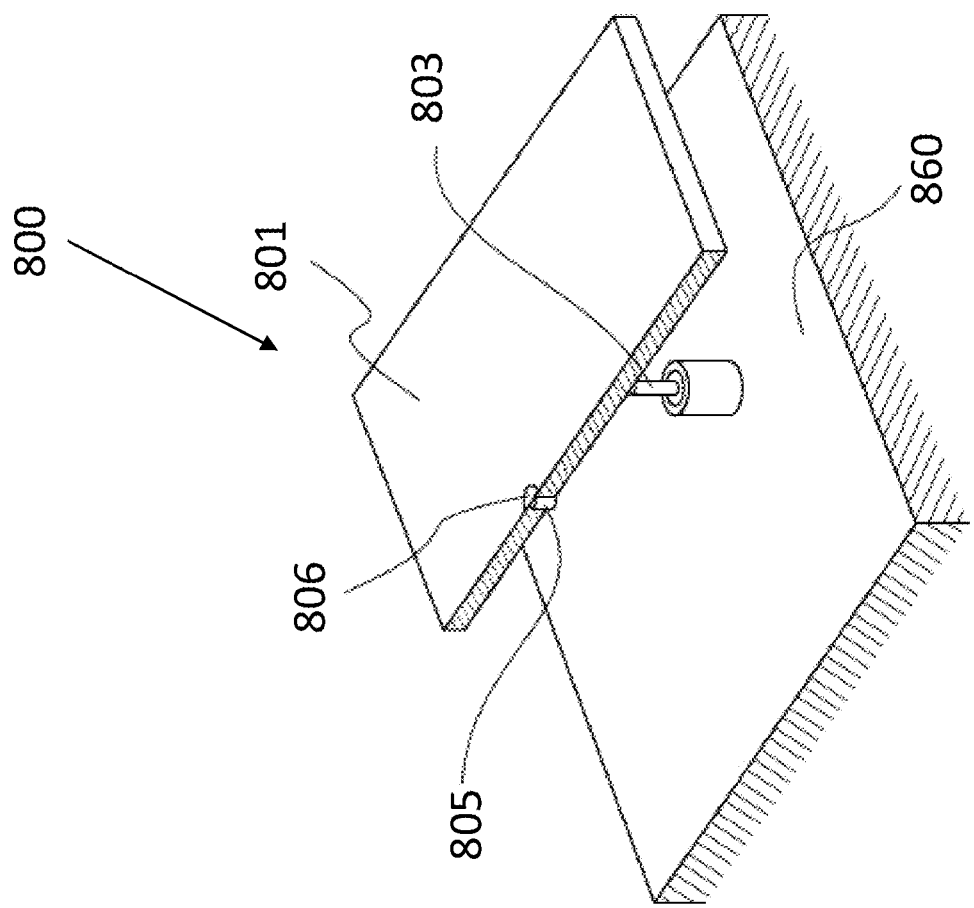
FIG. 11 illustrates a perspective top view of the embodiment of the plasma generating device of FIG. 10 with a portion removed.
Figure 12:
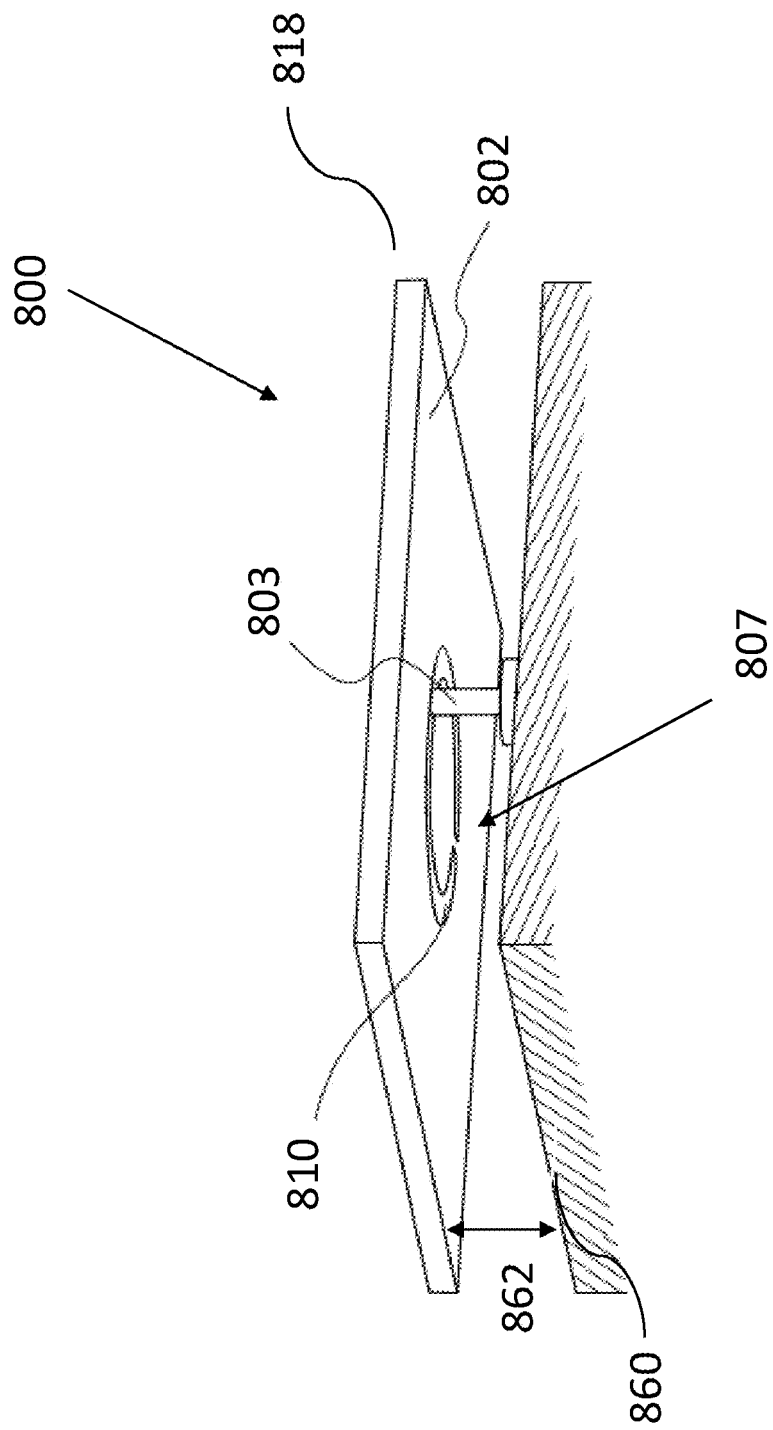
FIG. 12 illustrates a perspective side view of the embodiment of the plasma generating device of FIG. 10.

Turning now to FIGS. 10-12, another embodiment of the plasma generating device 800 is shown. In this embodiment, the plasma generating device 800 includes a dielectric support 818 with a process facing side 801 or first side that is exposed to an interior of a process chamber 500, cell chamber 408, or otherwise exposed to a semiconductor manufacturing process, and a non-process side 802 or second side. The non-process facing side 802 includes an antenna trace, resonator, or conductor trace 810 deposited on the dielectric support 818. In an embodiment, the dielectric support 818 and conductor trace 810 are prepared by an HTCC process. As shown, the conductor trace 810 has a split-ring configuration defining a gap 807 similar to other embodiments previously discussed. The conductor trace 810 further connects to a connector 803, such as an RF connector, that powers the plasma generation device 800. The non-process side 802 is positioned relative to a ground plane 860 such that there is a space 862 defined between the ground plane 860 and the non-process side 802 of the support 818. This space is generally and most conveniently filled with environmental air at atmospheric pressure as the dielectric, although other materials may be chosen to fill the space 862 taking into account stability or increased breakdown voltage. In an embodiment, the ground plane 860 is a ground reference for the conductor trace 810. Accordingly, it is possible to adjust the resonant frequency of the conductor trace 810 by increasing or decreasing the space 862 defined between the ground plane 860 and the non-process side 802 of the support 818. In an embodiment, this may be done by moving the ground plane 860 relative to the support 818. The space 862 may further be configured to stabilize the temperature of the plasma generating device 800 to prevent shifting of the resonance frequency as the plasma generation device 800 is operated.

The process side 801 of the support 818 includes a number of emitters 806, 808 (for example, two (2) emitters) comprised of aluminum. In an embodiment, the emitters 806, 808 may be further coated or partially coated with a thin layer of dielectric material to increase their inertness in the presence of semiconductor manufacturing processes. As shown, two emitters 806, 808 are present and are positioned adjacent to each other defining a space or gap 817 between them. Each emitter 806, 808 is connected to the conductor trace 810 on the non-process side 801 of the support 818 through a hermetically sealed via 805. Accordingly, the hermetically sealed vias 805 connect the emitters 806, 808 to the conductor trace 810 across a pressure threshold. As shown, the emitters 806, 808 comprise a tear drop shape and are positioned such that the gap 817 is formed between opposing pointed ends of the emitters 806, 808. In other words, the emitters 806, 808 are positioned as mirror images of each other across plane P as shown in FIG. 10.

In operation, the high electric field produced in the gap 817 between the emitters 806, 808 generates a plasma 400 (FIG. 3A) similar to the previously described embodiments. However, because the conductor trace 810 is positioned on the non-process side 802 of the support 818, it does not need to be buried in a ceramic matrix and therefore can be comprised of better, more highly conductive materials such as copper or silver. In an embodiment, the conductor 810 is prepared by conventional thick film and thin film processes rather than being limited to the lower conductivity metals such as tungsten compatible with HTCC process.

While the present invention has been particularly shown and described with reference to certain exemplary embodiments, it will be understood by one skilled in the art that various changes in detail may be effected therein without departing from the spirit and scope of the invention that can be supported by the written description and drawings. Further, where exemplary embodiments are described with reference to a certain number of elements, it will be understood that the exemplary embodiments can be practiced utilizing either less than or more than the certain number of elements.

The invention claimed is:

1. A plasma generation device for generating plasma from one or more gases inside of a chamber, the plasma generating device comprising:
   a support having a first side and an opposing second side, wherein the support comprises a ceramic matrix,
   a split-ring conductor embedded in the ceramic matrix,
   a hermetically sealed via extending from the split-ring conductor to the second side of the support and configured to connect to an electrical supply, and
   a ground plane formed on the second side of the support, and
   wherein a plasma is configured to be generated proximate to the first side of the support, and wherein the support is configured to seal to a wall of the chamber such that the first side is exposed to the one or more gases inside the chamber and the second side is isolated from the plasma and the one or more gases inside of the chamber.

2. The plasma generation device of claim 1, wherein the ceramic matrix is comprised of at least one of $Al_2O_3$ and AlN.

3. The plasma generating device of claim 1, wherein the ceramic matrix is comprised of one or more materials that are compatible with the plasma and the one or more gases inside of the chamber.

4. The plasma generation device of claim 1, wherein the split-ring conductor is comprised of a refractory metal.

5. The plasma generation device of claim 1, further comprising at least one plasma starting electrode, each electrode comprising a hermetically sealed via extending through the ceramic matrix from the first side to the second side of the support.

6. The plasma generation device of claim 5, wherein the at least one starting electrode is comprised of a refractory metal.

7. The plasma generation device of claim 5, wherein multiple starting electrodes are spaced relative to each other at predetermined distances to enable starting of plasmas over a predetermined range of pressures.

8. The plasma generation device of claim 1, further comprising a light collection element traversing the ceramic matrix and the ground plane, wherein the light collection element is configured to collect light emitted by the plasma and transport the light through the ceramic matrix and the ground plane for observation from the second side of the support, wherein the light collection element is hermetically sealed against the ceramic matrix.

9. The plasma generation device of claim 8, wherein the light collection element is a lens positioned proximate to the split-ring conductor, and wherein the lens comprises a curvature configured to optimize transferal of said light to an input field of view of one of: (1) an optical fiber; (2) optical fiber bundle; and (3) a spectrometer.

10. A gas sensor comprising:
a plasma generating device having a first side and an opposing second side, the plasma generating device comprising,
a split-ring conductor surrounded by a ceramic matrix and configured to generate a plasma proximate to the first side,
an optical element extending through the ceramic matrix between the first side and the second side, wherein the optical element is configured to collect light emitted by the plasma; and
a connector electrically connected to the split-ring conductor,
wherein the optical element is hermetically sealed to the ceramic matrix using one of: (1) a braze seal; and (2) a compression seal.

11. The gas sensor of claim 10, wherein said connector is an antenna connector configured to receive RF energy from a cable, and wherein an optical fiber is connected to the optical element and configured to receive light collected by the optical element.

12. The gas sensor of claim 11, further comprising remote electronics configured to interact with the gas sensor by means of the cable and the optical fiber, wherein the operation occurs at temperatures above 120° C.

13. The gas sensor of claim 10, wherein the plasma generating device is configured to be exposed to one or more gases within a process chamber and serves as part of a wall of the process chamber.

14. The gas sensor of claim 10, further comprising a ground plane formed on the second side of the plasma generating device.

15. The gas sensor of claim 10, wherein the split-ring conductor is comprised of a refractory metal.

16. The gas sensor of claim 10, wherein the first side of the plasma generating device comprises a polished surface.

17. A method of manufacturing a plasma generating device, the method comprising:
forming a support from a ceramic matrix in a green state, wherein the support comprises a first side and an opposing second side;
embedding a split-ring conductor and hermetically sealed via in the ceramic matrix as part of the forming of the support, wherein the hermetically sealed via extends from the split-ring conductor to the second side of the support;
firing said ceramic matrix with the embedded split-ring conductor;
positioning a ground plane proximate to the second side of the support before or after the firing; and
polishing the first side of the support to achieve a desired thickness of ceramic matrix between the first side and the split-ring conductor, wherein the desired thickness of the ceramic matrix corresponds to a desired resonance frequency.

18. A method of manufacturing a split-ring resonator plasma generation device, the method comprising:
providing a plurality of ceramic tapes;
creating at least one pattern of metallization on at least one of the plurality of ceramic tapes, wherein the at least one pattern of metallization comprises a split-ring resonator;
stacking the plurality of ceramic tapes;
firing the stack to produce a hermetically sealed antenna structure comprising a split-ring conductor in s ceramic matrix; and
polishing the hermetically sealed antenna structure in an area over the split-ring conductor.

19. The method of claim 18, wherein a measurement or measurements of a characteristic or characteristics of the antenna structure, such as resonance frequency, quality factor, and dielectric thickness is used to determine an endpoint of the polishing.

20. The method of claim 18, further comprising adding witness marks to the same metallization pattern as the split-ring conductor, wherein during a cutting process, the witness marks are exposed to be used to guide the polishing to a target thickness.

21. A gas sensing system comprising:
a plasma generation device comprising,
a split-ring resonator microstrip comprising,
a split-ring conductor, and
a ceramic matrix configured to surround and support the split-ring conductor; and
a temperature sensor in thermal communication with the plasma generation device to determine the temperature of the plasma generation device, wherein the temperature of the plasma generation device is taken into account during operation of the gas sensing system.

22. The gas sensing system of claim 21, further comprising a heater in thermal communication with the plasma generation device, wherein the heater and the temperature sensor are configured to control the temperature of the plasma generation device.

23. A gas sensing system comprising:
- a plasma generation device comprising,
- a split-ring resonator microstrip comprising,
  - a split-ring conductor, and
  - a ceramic matrix configured to support the split-ring resonator microstrip, wherein the split-ring conductor is embedded within the ceramic matrix; and
- a two-connection flow through gas cell defining a gas passage through a plasma chamber, wherein the gas cell comprises an optical window positioned substantially across the plasma chamber from and parallel to the ceramic matrix of the plasma generation device,
- wherein the gas cell is configured to provide a gas flow in a direction that is substantially parallel to a plane of the plasma generation device and a plane of the optical window, wherein the gas passage and the plasma chamber comprise features of a size smaller than about 10 mm along a direction that is substantially normal to the direction of gas flow.

* * * * *